United States Patent [19]
Benayoun et al.

[11] Patent Number: 6,026,089
[45] Date of Patent: Feb. 15, 2000

[54] PACKAGE STRUCTURE FOR COMMUNICATION EQUIPMENT

[75] Inventors: Alain Benayoun, Cagnes sur Mer; Jean-Francois Le Pennec, Nice; Patrick Michel, La Guade; Patrick Cavallo, Nice, all of France

[73] Assignee: International Business Machines Corporation, Armonk, N.Y.

[21] Appl. No.: 08/770,931

[22] Filed: Dec. 20, 1996

[30] Foreign Application Priority Data

Dec. 20, 1995 [FR] France ................................ 95 480183

[51] Int. Cl.⁷ ........................... H04L 12/28; H04L 12/56; H04Q 5/00
[52] U.S. Cl. .......................... 370/395; 370/395; 370/390; 370/418; 340/147; 340/825
[58] Field of Search ..................................... 370/390, 395, 370/58, 380, 381, 413, 412, 418; 340/147, 825; 361/394, 415, 393, 396, 413, 419, 375; 439/157, 160, 152, 155, 158, 372

[56] References Cited

U.S. PATENT DOCUMENTS

| | | | |
|---|---|---|---|
| 3,005,131 | 10/1961 | Melcher et al. | 339/186 |
| 3,386,010 | 5/1968 | Nojiri | 339/186 |
| 3,594,689 | 7/1971 | Hopt et al. | 339/17 |
| 4,243,283 | 1/1981 | McSparran | 339/14 |
| 4,423,465 | 12/1983 | Teng-Ching et al. | 361/394 |
| 4,614,389 | 9/1986 | Albert et al. | 339/45 |
| 5,271,582 | 12/1993 | Perkins et al. | 244/158 |
| 5,575,672 | 11/1996 | Katsuma | 439/157 |
| 5,636,210 | 6/1997 | Agrawal | 370/390 |
| 5,691,885 | 11/1997 | Ward et al. | 361/735 |

OTHER PUBLICATIONS

Proceedings of the 1989 Int'l Conference on Parallel Processing, vol. 1, Aug. 8–12, 1989, PA USA pp. 323–327.
"An Impact of Advanced VLSI Packaging on the Design of a Large Parallel Computer" Abhaya Asthana et al.

*Primary Examiner*—Michael Horabik
*Assistant Examiner*—Man Phan
*Attorney, Agent, or Firm*—Joscelyn G. Cockburn

[57] ABSTRACT

A package for a communication equipment fitted with mechanical locking mechanism and electrical and communication connectivity for allowing power supply distribution as well as communication at least at four distinctive faces (UP, DOWN, RIGHT, LEFT). Each communicating face is fitted with optical transmission and reception devices allowing digital communication between adjacent apparatuses. Each package comprises two faces having each one protrusion at one surface that is intended to enter into a groove machined at a corresponding surface of the next adjacent package in said structure. Each protrusion comprises a locking mechanism for power supply that comprises a camming hook (2200) having a distal end which forceably engages a locking aperture (2210) when pivoted. The hook is pivotally coupled to an axel (2101) extending respectfully through an elongated aperture (2301) formed at one end of a lever arm (2300), and an elongated aperture (2302) of the hook. The lever arm (2300) having a dielectrical non-conductive distal end including at least one recess (2411). The bottom of the recess engages at one end of a first compression coil spring (2405) whose other end is spring biased against a first washer (2403) whose lower surface thereof engages a second compression coil spring (2410), the lower end of which engages the interior surface of the protrusion of the adjacent package. A rod extending through an electrically insulated aperture of said lower surface of said protrusion has a lower end being rigidly secured to a second washer (2407) and an upper end being rigidly secured to said first washer (2403). The lower end of the rod faces an electrical contact (2402) connected to a power supply electrical wire which is affixed to the upper surface of the adjacent package. The pivotation of said camming hook (2200) parallely causes the locking and the electrical connection of said package.

7 Claims, 21 Drawing Sheets

TOWER DEVICES DATA FLOWS

OPTICAL LINKS WHEN BRICKS ADJUSTED

RIGHT VIEW
TOWER OPTICAL COUPLING

TOP VIEW

POSITIONING AND POWERING SYSTEM WITH QUARTER SCREW

CLEARANCE CREATION MECHANISM FOR TOWER STRUCTURE MODULES
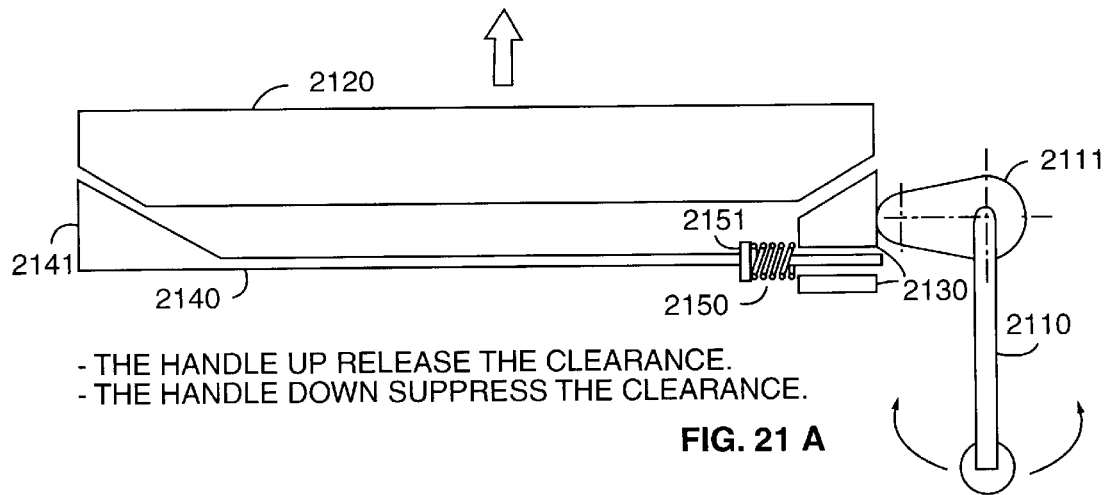
- THE HANDLE UP RELEASE THE CLEARANCE.
- THE HANDLE DOWN SUPPRESS THE CLEARANCE.
FIG. 21 A
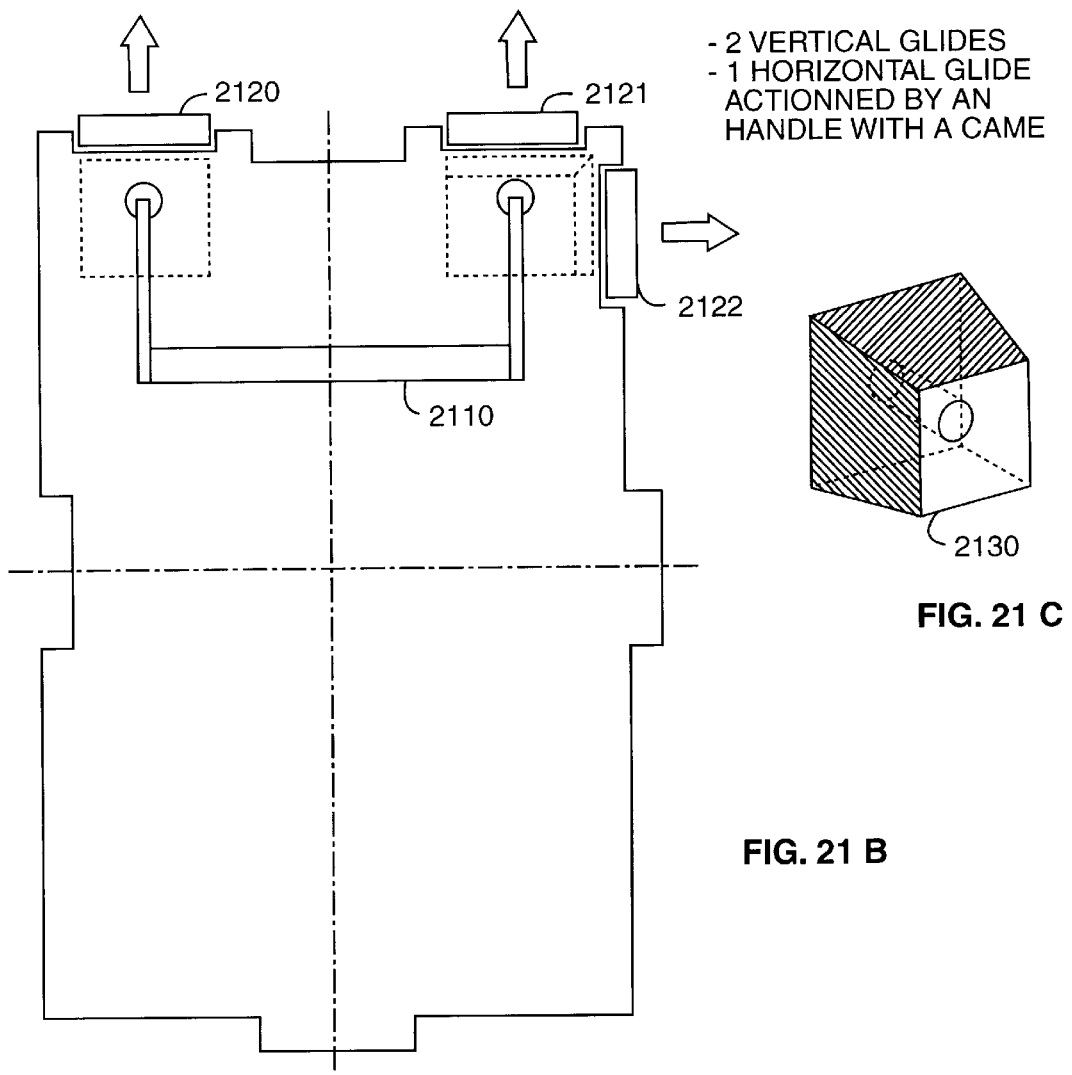
- 2 VERTICAL GLIDES
- 1 HORIZONTAL GLIDE ACTIONNED BY AN HANDLE WITH A CAME
FIG. 21 C
FIG. 21 B

PACKAGE STRUCTURE FOR COMMUNICATION EQUIPMENT

CROSS REFERENCE TO RELATED PATENT APPLICATION

This application relates to patent-application Ser. No. 08/771,568, now U.S. Pat. No. 5,959,992, filed Dec. 20, 1996, assigned to the assignee of the present invention.

TECHNICAL FIELD

The invention relates to packaging in the telecommunication field and more particularly to a package for a communication equipment which is fitted with mechanical locking means and electrical and communication connectivity means for allowing communication with at least four distinct connected apparatuses.

BACKGROUND ART

Telecommunications equipments involve the use of rapidly evolving technology and techniques. This continuous evolution obviously tend to render the products rapidly out of date, thus preventing the manufacturers to take profit from the expected return on investments.

A partial solution to this need for continuous evolving techniques can be found in the possibilities for a manufacturer to base his design of new products on the use of different cards that are assembled in order to embody a more powerful and more sophisticated product. Such a solution is particularly used in the field of personal computer where new products are based on the use of many different sub-elements and interface cards.

In the telecommunication field the market discloses some stackable or rack-mounted products. This provides some possibilities of evolution and reduced size.

However this solution is not entirely satisfactory. Indeed, in this field the possibilities to assemble different cards and sub-elements provided by different telecommunication manufacturers appears limited since no accurate common way of connection for the different elements actually exists. Additionally, the known solution do not achieve the possibility of hot-plugging of any element on the stack, lateral extension, etc . . . , which would make the design and use of equipment much easier.

Generally network design includes several products interconnected together where the customer would prefer a single product line proposal, easier to install, to manage, open to evolution.

SUMMARY OF THE INVENTION

Therefore the problem to be solved by the present invention is to provide a possibility of easily integrating telecommunication functions in order to embody a sophisticated telecommunication product, with the possibility of allowing hot-plugging, and easy update of the different elements forming the product.

The object of the present invention is to provide an uniform possibility of integrating networking independent products and some small and medium size computers used in networking.

This problem is solved by the apparatus that is defined in the set of claims.

The object of the invention is provided by means of an apparatus that includes mechanical and electrical connection means for allowing the attachment and the plugging of additional apparatus of the same type in order to constitute a more sophisticated Tower Structure. The attachment is made possible at least either on the Left side, the Right side, the Top side or the bottom side and the communication between one apparatus and its neighbours is allowed by means of frames comprising a routing header of n bytes with n being an integer, said header being followed by an Asynchronous Transfer Mode (A.T.M.) cell.

Basically each apparatus in the structure comprises:

first receiving means and first transmitting means for respectively receiving a data flow from and for transmitting a data flow to an Upwardly attached first apparatus;

second receiving means and second transmitting means for respectively receiving a data flow from and for transmitting a data flow to a Downwardly attached second apparatus;

third receiving means and third transmitting means for respectively receiving a data flow from and for transmitting a data flow to a Leftwardly attached third apparatus;

fourth receiving means and fourth transmitting means for respectively receiving a data flow from and for transmitting a data flow to a Rightwardly attached fourth apparatus;

storage means for storing data flows coming either from said receiving means or to be transmitted to said transmitting means;

switching means comprising at least four input ports that are respectively connected to received data flows coming from said first, said second, said third and said fourth receiving means; said switching means further comprising at least four output ports that are respectively connected to transmit data flows to said first, said second, said third and said fourth output ports in accordance with parameters loaded by the first n bytes of said frame;

control means for controlling said switching means so that the frame is routed to the appropriate output port. This allows communication between any elements in the structure by means of an unlimited possibilities of routing paths.

Preferably each of said first, second, third and fourth receiving means includes means for dynamically modifying said routing header of said frame in accordance with parameters (VPI, VCI) loaded into said ATM cell before the frame is presented to one input port of said switch (200).

Each apparatus includes functional means for embodying a telecommunication service function, such as ISDN gateway, echo cancellation or data compression that is likely to be needed in said Tower Structure, said telecommunication service function establishing Asynchronous Transfer Mode sessions with another apparatus of the Tower Structure in order to exchange frames including a routing header and a ATM data cell that are dynamically forwarded throughout intermediate apparatuses situated on the routing path.

The invention also provides a process for operating a communication equipment comprising a set of mechanically connected apparatuses being vertically and horizontally packed. Each apparatus comprises telecommunication functions such as echo cancellation data compression or ISDN gateway, as well as vertical and horizontal mechanical and communication connections respectively allowing the vertical and horizontal exchanges of frames with neighbouring apparatuses. The communication is based on a frame comprising n bytes routing header with n being an integer and an Asynchronous Transfer Mode (A.T.M.) cell.

The process in accordance with the present invention involves the steps of establishing ATM sessions for each communication between a first and second apparatuses of said structure whereby said first apparatus can access to the telecommunication functions located into said second apparatus; said ATM sessions being established under control of one particular apparatus of the structure being devoted to the role of Tower Manager assigning sessions parameters (VP/VC) to any new request of ATM sessions.

Preferably, each ATM session that is established between two apparatuses involves the running of a counting process for automatically transmitting, after a predetermined period of inactivity of the session, a signalling ATM cell that allows checking of the session.

In a preferred embodiment the process further involves the step of assigning, for each vertical and horizontal segment of said structure, a particular Segment Manager which has the role of forwarding to said Tower Manager any registration request initiated by a new apparatus being plugged in said segment during an registration procedure. In the registration procedure each newly plugged apparatus transmits a specific registration request to any vertical and horizontally connected neighbouring apparatus. This request is then forwarded by each vertical or horizontal neighbour to their respective vertical and horizontal segment manager which, eventually, forwards the request to the Tower Manager. The latter may then establish a new ATM session with the newly plugged apparatus by assigning a new VP/VC parameters.

In a preferred embodiment, the VP/VC parameters that are assigned to each ATM session is associated with a particular topographical routing path that is defined by the Tower Manager and that is used for the transmission of the ATM cells of that ATM session throughout the different intermediate apparatuses belonging to that routing path. Each apparatus that receives a frame that belongs to a particular ATM session locally computes the appropriate value of the routing header corresponding to said VP/VC parameters in accordance with the routing path that was defined by said Tower Manager at the assignment of the ATM session. The routing header which is locally computed can then control an internal switching mechanism.

Therefore, an enhanced telecommunication equipment is achieved, based on a set of modular apparatuses performing the process of the present invention.

More particularly, the invention also provides a package for communication equipment which is fitted with mechanical locking means and electrical and communication connectivity means for allowing power supply distribution as well as communication at least at four distinctive faces (UP, DOWN, RIGHT, LEFT). Each communicating face is fitted with optical transmission and reception means allowing a digital communication between adjacent apparatuses. Each package comprises two faces having each one protrusion at one surface that is intended to enter into a groove machined at a corresponding surface of the next adjacent package in said structure. Each protrusion fitted faces comprises a locking mechanism for power supply that comprises a coming hook having a distal end which forceably engages a locking aperture when pivoted. The hook is pivotally coupled through an axis extending respectfully through an elongated aperture formed at one end of a lever arm, and an elongated aperture of the hook. The lever arm has a dielectric non conductive distal end including at least one recess. The bottom of the recess engages one end of a first compression coil spring whose other end is spring biased against a first washer whose lower surface thereof engages a second compression coil spring, the lower end of which engages the interior surface of the protrusion of the adjacent package. The first coil spring has a rate being higher than the rate of said second coil spring. A rod extending through an electrically insulated aperture of said lower surface of said protrusion has a lower end being rigidly secured to a second washer and a upper end being rigidly secured to said first washer. The lower end of rod faces an electrical contact connected to a power supply electrical wire and which is affixed to the upper surface of the adjacent package. The pivotation of said camming hook parallely causes the locking and the electrical connection of said package.

Preferably at least one face of each package comprises a rigidity and clearance mechanism for providing clearance allowing easy removal of the package. The clearance mechanism comprises:

at least one clearance bar fitted with a first and a second bevel; said clearance bar suppressing clearance that naturally exists between two adjacent packages, a fixed wedge facing and extending along said first bevel of said at least clearance bar;

a wedge being movable in translation with respect to said fixed wedge, said wedge facing said second bevel of said clearance bar;

a handle for pivoting an eccentric biasing said movable wedge, whereby the rotation of said handle causes movable wedge to space apart from fixed wedge, resulting in a downward movement of said clearance bar reinstoring a clearance between said package and its neighbouring package.

DESCRIPTION OF THE DRAWINGS

FIG. 21A illustrates the clearance mechanism.

FIG. 21B illustrates the lateral face of one Brick showing the clearance bars.

FIG. 21C shows a perspective view of part 2130 having the form of a quarter of frustum of a pyramide.

DESCRIPTION OF THE PREFERRED EMBODIMENT OF THE INVENTION

The apparatus in accordance with the present invention takes the form of a structure comprising three distinctive sets of elements or devices: a set of power supplies; a set of interfaces and a third set of element embodying the logical functions of the product. In the invention each function will be located in basic element—so called a elementary brick—that forms a part of the structure. Each brick in this structure is interconnected with its neighbor brick thanks to two (vertical and horizontal) connector-less optical high speed parallel ATM LANs able to transport transparently circuit or LAN data from the interface box to the function box or between two different function boxes. There still remains the possibility to keep the classical interconnection by means of the traditional bus interfaces through classical connectors in order to allow the possibility to attach existing products at a lower cost. However, it is expected that most elements will be designed by means of the ATM Lans concepts of the invention. By means of a specific mechanism each box is hot pluggable and hot unpluggable at any time.

The bottom line of the structure is composed of the power boxes. Interface boxes location is recommended to be, if possible, above this first line and functions boxes will be generally installed above the interface boxes.

This physical and logical split of functions will offer the following advantages Single network, product view Built in redundancy 1 to n Modularity, expandability, reliability Shared interfaces and power Only one design required for all functions minimizing EMI design, Reduction of tests and homologations Shared server functions between devices Reduce time to market and development cost for all new products Simplify sales and marketing Reduce the number of parts and complexity for the field support Increase the profit margin thanks to the above advantages Reduce considerably the size required or the networking equipments in the DP center.

Figures 1A, 1B:
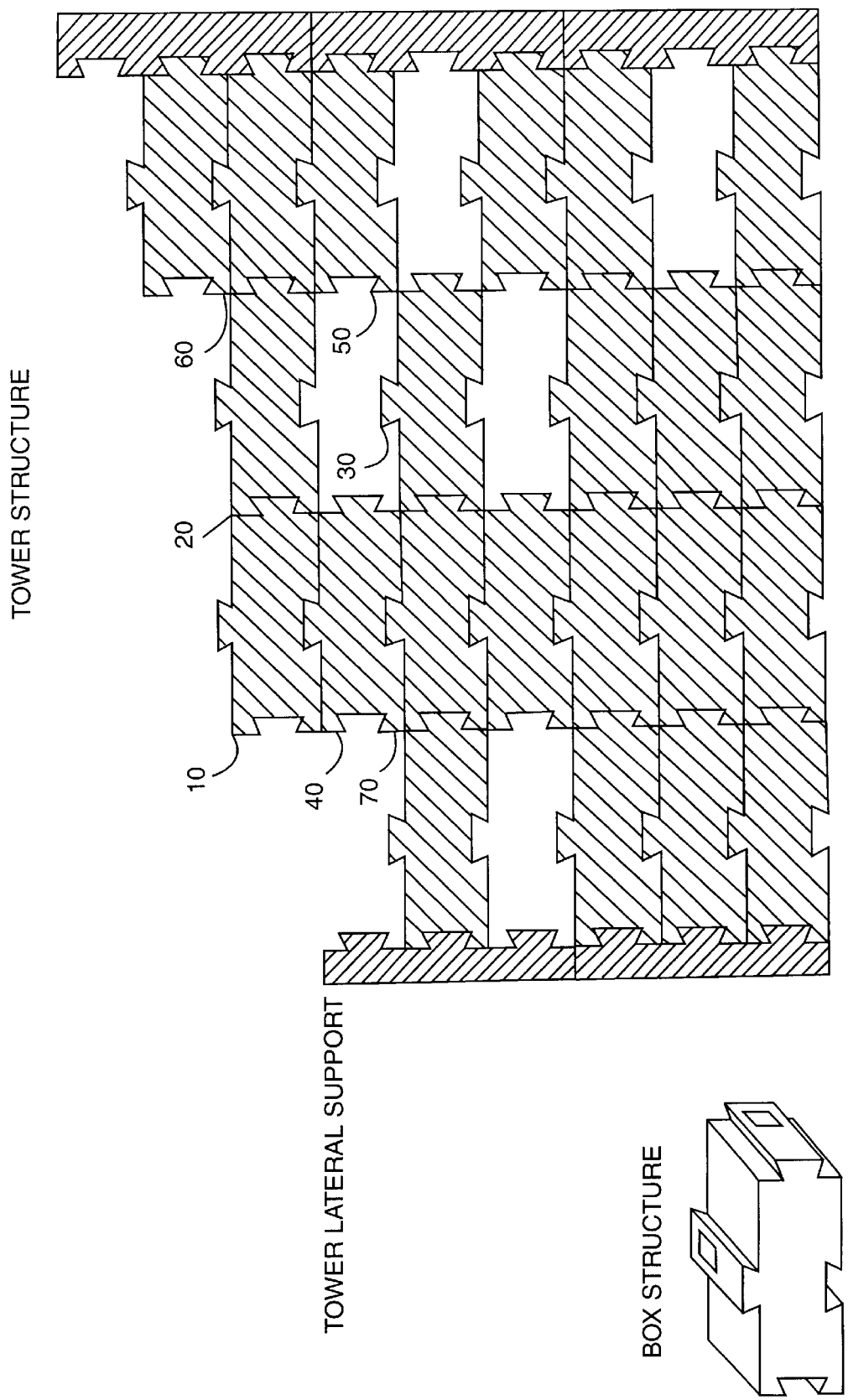
FIG. 1a illustrates the general architecture of the Tower structure in accordance with the present invention.
FIG. 1b shows a schematic view of one elementary Brick in accordance with the present invention.

This new concept is applicable not only on networking products but also on small and middle range Computers to offer to the customer a fully integrated structure in its processing area. Correction can be made on each unit, by removing it from the structure without any impact on the other running activities. This new concept will not compete with current products from competitors but to offer to the customer a brand new approach for network centric data/voice systems allowing him to reduce its operation cost, improve the availability of the global system. Finally, the customer benefits will be:

Single product management reliability, redundancy expandability, security on investment Functions Performance Global network cost reduction Equipment optimization Human resource optimization FIG. 1a shows the very general architecture of the product in accordance with the present invention. As it is represented in the figure, each function being required takes the form of a standardized package, hereinafter called an elementary Brick, for instance elements 10, 20, 30 or 40.

An example of the particular form of one package is illustrated in FIG. 1b and is so designed as to receive a 4-way connection with its neighbouring bricks. The electrical and mechanical connections is designed in order to permit each brick to be plugged and unplugged to another one, thus satisfying a great number of customer requirements and a quasi unlimited number of combinations. In FIG. 1a there is represented a particular arrangement where some locations in the structure are lacking with a functional bricks. This is the case of the location which is between brick 20 and 30. The present invention makes possible such an arrangement. As will be shown hereinafter with greater details, this is achieved either by making a derivation of the data flow to the neighbouring functional bricks 10, 40, 60 and 50, or by using a specific brick which is placed with the empty location, a so-called by-pass brick which is designed for allowing the the data flow in the two perpendicular directions, vertically between bricks 30 and 20; horizontal between 40 and 50.

As illustrated in the figure, each functional brick need a particular form which allows the customer to easily plug and unplug one brick to the others. Such a form is symbolized in the figure by the use of a dovetail or any other specific forms that prevent the plugging of the brick in the wrong position and provide rigidity of the structure.

Figure 2:
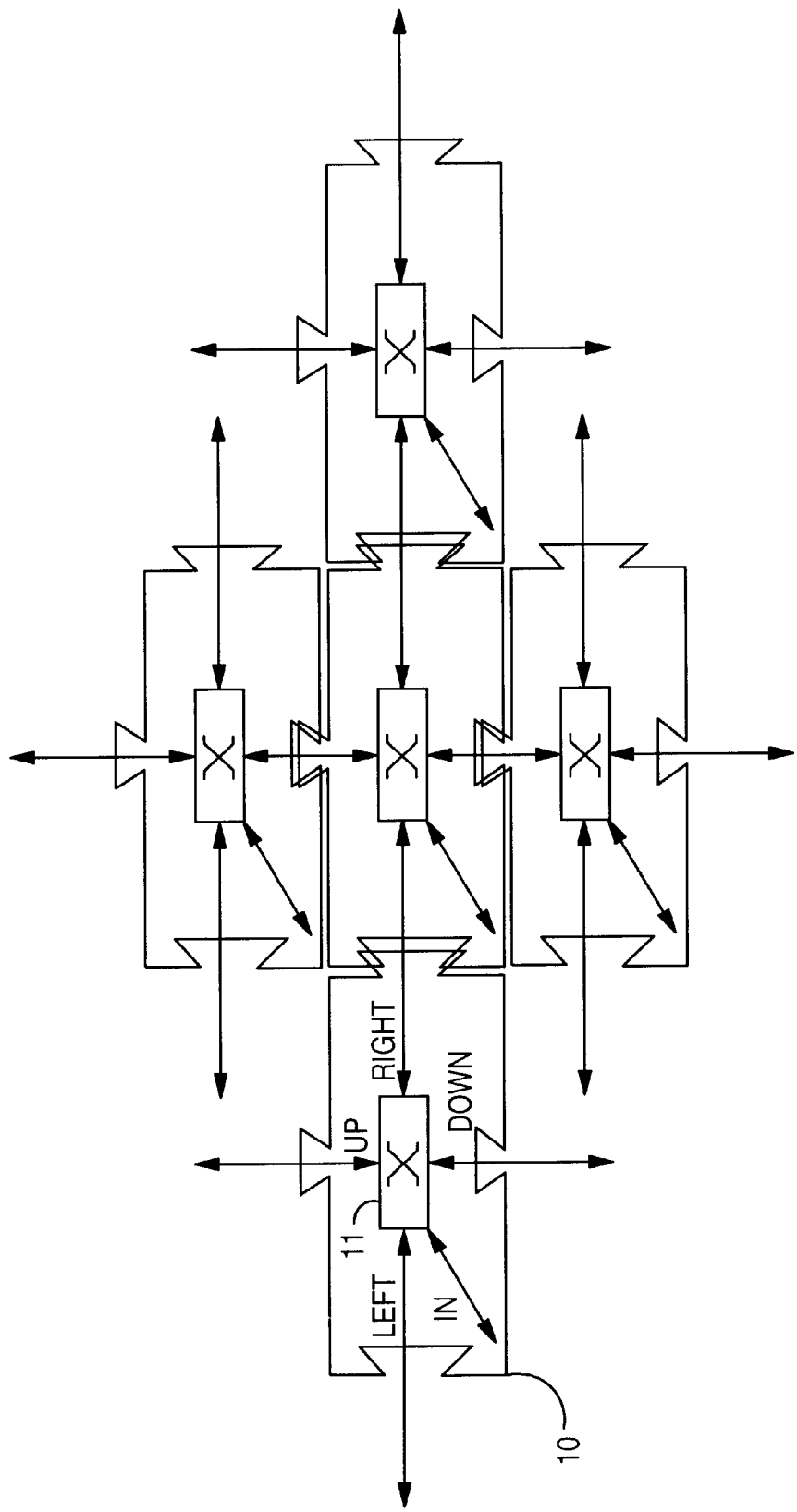
FIG. 2 is a synoptic view of the logical connectivity which is integrated in each elementary Brick in accordance with the present invention.

FIG. 2 illustrates the synoptic view of the logical connectivity which is integrated in one elementary brick, brick 10 for instance in the figure. Each brick integrates a switching system 11 which is based on an Asynchronous Transfer Mode (ATM) switch which can be for instance the ATM switch as described in The IBM publication, entitled "Asynchronous Transfer Mode; technical overview", published on October 95, reference SG24-4625.

However it should be noticed that the invention can be embodied with other existing switches, using variable length frames. As illustrated in FIG. 2, the elementary brick 10 incorporates at least five full-duplex communication links, four distinctive for the neighbouring elements (up-down-right and left), and an additional link (In) which is dedicated to the communication data flow with the internal logical function which is located within the brick. Switching system 11 decodes the address which is existing in the ATM cell which is received from one input link, LEFT link for example, and determine, as will be described hereinafter with numerous details, the appropriate output link which will be used for forwarding the data cell.

This fully meshed ATM network implemented in the Tower will be called hereafter Tower Area Net (TAN).

The object of this new structure is to give the capability to split products in elementary functions, each function being able to be located in a different brick. To achieve this a standardized interface based on ATM communication links is used between all elementary functions.

The objective is to be able to reuse elementary functions made by different partners in order to offer more functions and expandability compared to classical limited products.

Another goal is also to share functions between several virtual products. For example Interface bricks may provide interfaces for several functions: one for a Router, one for a X.25 node, one for an ATM node, one for a Frame Relay node, one for a Voice Server . . . All belonging to the same Tower structure even if they have no direct functional relationship. The only channel between the Physical access brick and the logical function brick or between two logical function bricks will be the internal Tower Area Network (TAN) of the tower.

Figure 3:
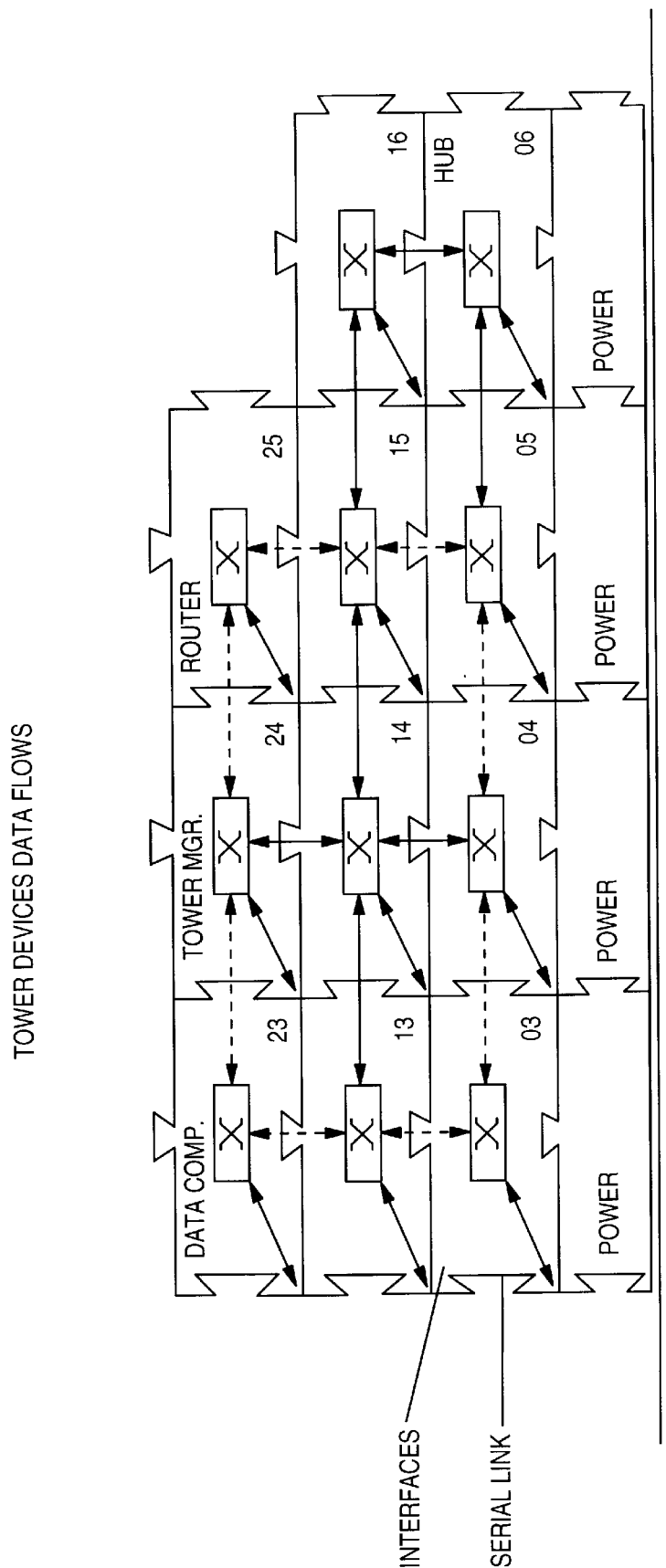
FIG. 3 shows an illustrative example of the splitting of telecommunication functions into some different elementary Bricks in accordance with the present invention.

FIG. 3 describes the splitting of all functions in specific Bricks. There are shown, for example, Interfaces Brick (03), Router Brick (25), Hub Brick (06), Tower Manage Brick (24), Data_Compression Brick (23) . . . Another Brick called Power Brick, located at the Bottom of the Tower Provides Power supplies and Cooling to above Bricks. Except for Power Bricks, ATM links are established between any two Bricks among all belonging to the Tower structure.

The invention is based on the fact that any relationship between the different layers, previously implemented thru specific data, clock and control flows or signals are now mapped within ATM cells. The ATM standards which are defined to adapt current network traffics to ATM—so called ATM adaptation Layer (AAL) corresponding to the Layer 2 (link level) of the ISO Layer model—are used for achieving data and control communication between two bricks.

To achieve this the available ATM WAN or ATM LAN requirements are specifically adapted in order to embody the ATM Tower Area Network of the present invention. As known in the art, four AAL classes of service are defined by the ITU-T: Class A to Class D. One additional is used by the ATM forum class X for user defined services such as control, signaling or other flows.

Higher layers will not be discussed as they are transparent for the tower structure Lower layers like ATM layer and Physical layer, both included in the Layer 1 (Physical) of the ISO layer model is particularly adapted in order to elaborate the protocol managing the tower structure of the invention. On top of all data transmission between two bricks of the tower, each one containing one or several sub-channels of communication, an additional signaling protocol which is able to handle all controls needed between these two boxes is implemented. This signaling protocol will use specific ATM cells and will provide specific controls within the tower.

Signaling cells are cells having a specific Payload Type, as represented below with VPI standing for Virtual Path Identifier; CLP representing Cell Loss Priority; and HEC being the Header Error Check.

Payload Type (PT) is a defined 3 bits field of the header of an ATM cell composed of 53 bytes as follow:

| VPI | VCI | PT | CLP | HEC | DATA (Payload) |
|-----|-----|----|----|-----|----------------|
| 12  | 16  | 3  | 1  | 8   |                |

← - - - - - - - 5 bytes - - - - - - - >< - - - - - - - - 48 bytes - - - - - - - - →

Signaling cells may also be cells with a specific Virtual Channel Identifier (VCI) field. The only restriction is that the VPI and optionally some of the MSB bits of the VCI should be the same for a data transmission between two bricks of the tower and for the associated signaling. The reason is to pass thru the same switching mechanisms within the tower in order to work if the data transmission work and to fail if data transmission fail to achieve this some of the LSB bits of the VCI field are not used not checked by the switching mechanism implemented on each brick. Thanks to this, only the signaling channel need to be analysed within the tower to analyse communication problems as in the preferred embodiment of the tower structure. Each brick will continuously send signaling cells when needed to insure that internal links are still working correctly. The way it works is described hereafter.

Classical call and connection control operation includes call establishment procedures (Setup, Call Proceeding, Connect, Connect Acknowledgment . . . ), call clearing procedures (Release, Release Complete), Status (status inquiry, Status) as defined by the ITU-T (E.164). All the messages will be used within the tower for managing the calls but on top of this messages, new messages will be generated to insure the data link control thru the tower.

With reference to FIG. 3 again, an illustrative example of the start of one communication between Brick 03 (Interfaces) and Brick 25 (Router) can be described. This is achieved by the following path Bick03-Brick13-Brick23-Brick24-Brick25. The procedure first begins with the transmission of a setup message. The process then proceeds with data transfer and a failure is assumed to occur in Brick13:

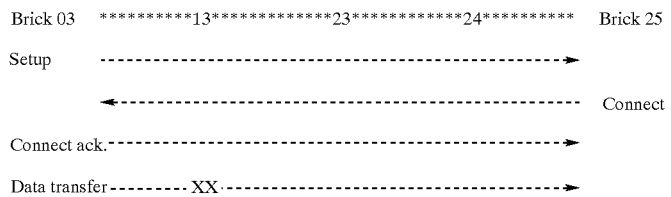

Once the Call establishment is completed the data transmission can start. It should be noticed that an internal problem within the tower and a failure in the data transmission might occur. Without any additional control, this entails the abort of the data transmission. In that case the full connection process has to be redone by the end user application. If such a process appears acceptable for external links, the use of ATM links inside a communication apparatus can be improved by taking profit of the alternate paths that exist within the tower structure in order to enhance reliability, to achieve hot pluggability of bricks and redundancy.

To achieve this, intermediate signalling cells are involved which are based on the use of a timer value in order to maintain a continuous flow between the two end bricks. If data cells are sent within this timer value, it will reset the timer as the checking on the receive side that the link is good may be done either on signaling frames or on data frames. If no data are transmitted and the timer has expired, the process automatically generates a signaling frame which can then be sent. An equivalent timer is set on the receive side. When a frame is received from the originating brick, the receive timer is reset. If the receive timer expires, probably revealing the occurrence of a failure in the link, a recovery procedure is started in order to identify the nature of the failure and to proceed with the establishment of a new link between the two bricks. As this process may be very fast (depending on the value given to the timer), it is possible to re-establish a link before having the call down set by the DLC (Data Link Control) control points. For example, this kind of failure may occur if Brick13 is unplugged from the tower. In that case the Tower Manager (Brick24 in our case) will be informed of the failure by Brick25, an alternate path will immediately and dynamically be established for example thru Bricks: 03-04-05-15-25.

Additional usage of intermediate signaling cells can be the control of the interface, especially in switched environment in order to 'deport' the control of the interface in another brick. This kind of signaling cell may have following fields: speed, leads, loops . . . either as command (write) or value (read). These fields will be included in the Payload Field of a Signaling Cell. Additionally, one signaling channel handles several interfaces within the same interface Brick.

Signaling flows on both sides are asynchronous, even timers may have different values and is more suitable in this environment than acknowledge based protocols. Of course, the tower management system provides such signaling links with the same path given to the associated data links and the switching of both cell types is to done by the same hardware process which cannot identify whether the cell type is data or signaling.

This is described with many details in the following description with respect to FIGS. 4 to 7.

Figure 4:
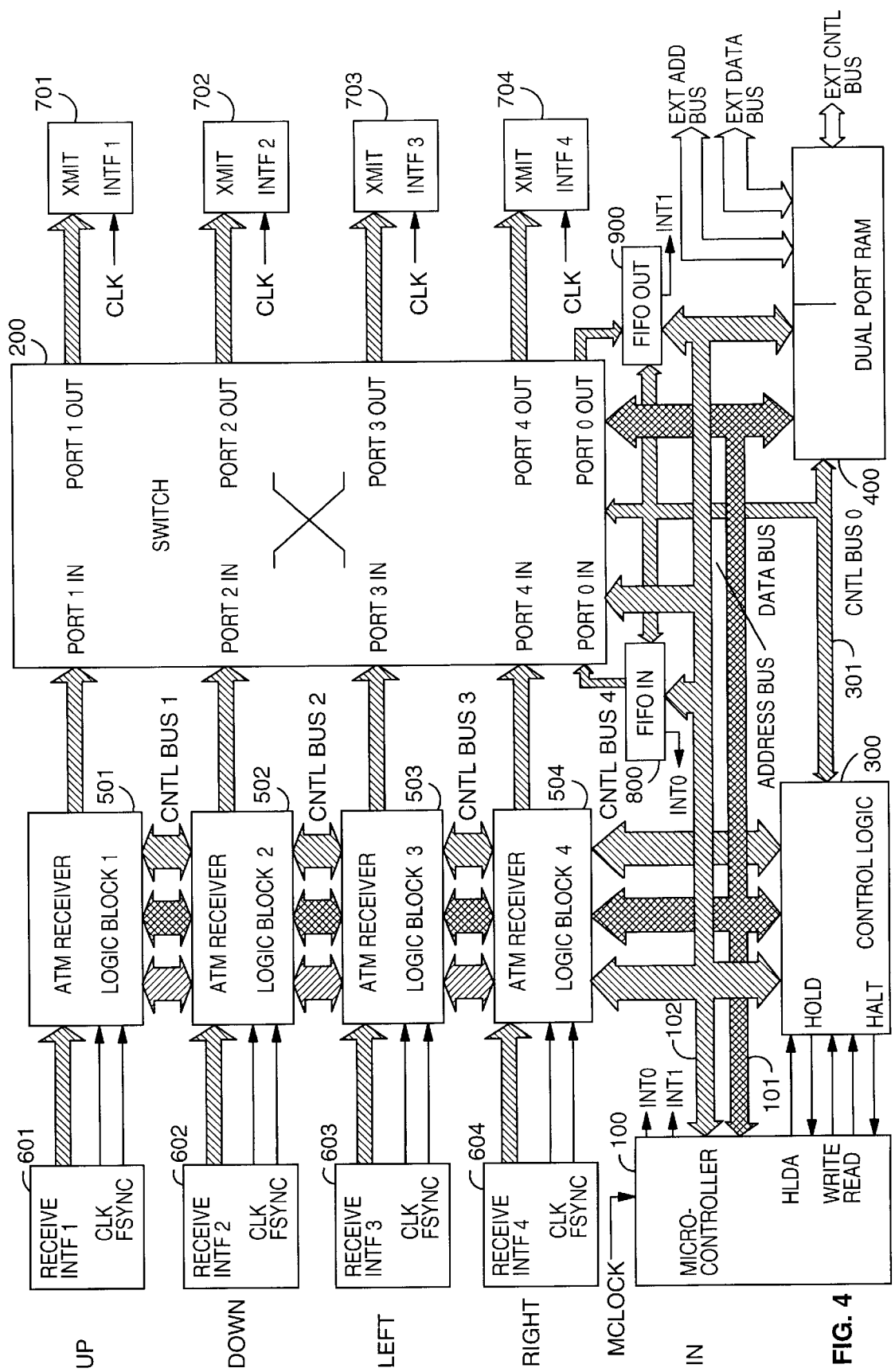
FIG. 4 shows the preferred embodiment of the switching mechanism that is used in every elementary Brick in accordance with the present invention.

FIG. 4 presents the preferred embodiment of the switching mechanism that is used in each Brick of the Tower.

Each elementary Brick basically comprises functional circuitry which achieves the desired telecommunication function, be it data compression, link interface etc . . . Details relating to such known devices will not be further described since any prior art circuitry can be embedded in the elementary Brick of the invention. Additional to the basic functional circuitry, each Brick further includes routing circuits that interface a dual port RAM that will be used for achieving the routing and exchange of cells between the Brick and its contiguous neighbouring Bricks.

The above mentioned routing circuits comprises some distinctive sub-components that provide the handling and the routing of data cells, the Brick being either an ending point to the data cell communication or and intermediate Brick of the routing path that is used between two ending points in the tower structure.

This common logic is composed of several main sub-components. A first one is a micro-controller 100 such as Intel 80196 used to control all transmissions between this Brick and the other Bricks in the Tower. Microcontroller communicates via a Dual_Port RAM 400 and a Control Logic 300 with the specific function of each Brick using three buses: ext_add_bus, ext_data_bus and ext_cntl_bus.

A second basic component of the elementary brick consists in a switching system that is based on an ATM switch 200 such as an IBM switch described in the above mentioned IBM publication "Asynchronous Transfer Mode; technical overview", on which two FIFO are implemented, a FIFO_IN 800 used to transfer data from Dual_port_RAM 400 to Port_0_IN of Switch 200 and a FIFO_OUT 900 used to transfer data from Port_0_OUT of switch 200 to Dual_port_RAM 400. Both FIFOs are controlled by micro-controller 100 thanks to Control_Logic 300 and cntl_bus_0 301.

Figure 5:
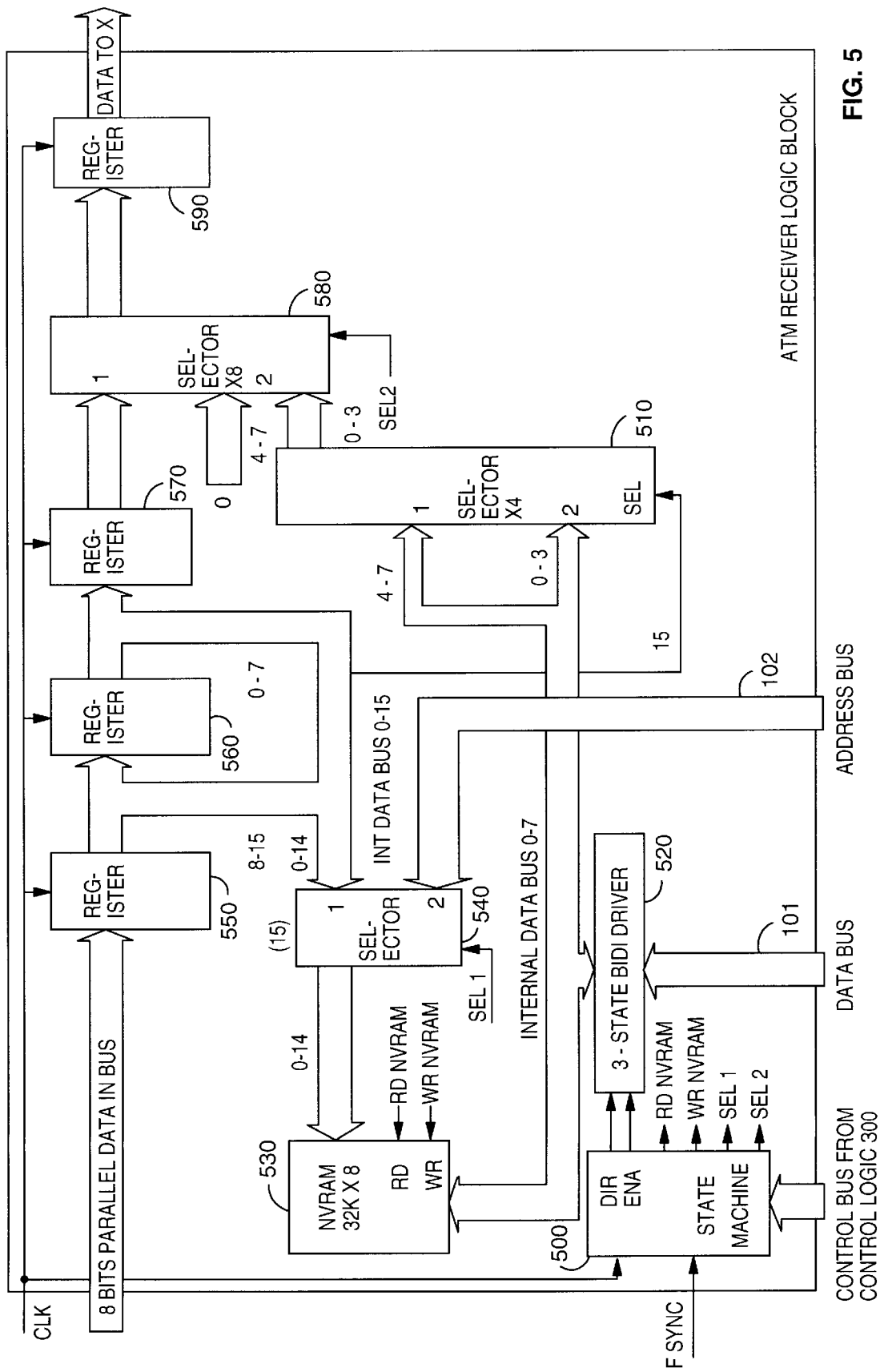
FIG. 5 illustrates the details of the ATM receiver logic block 501–504 (FIG. 4).

Further, the apparatus located into each Brick comprises a set of four devices, respectively called ATM_Receiver_Logic_block 1 to four connected to the external input of Switch 200. Each of ATM_Receiver_Logic_block 1 to 4 is respectively referenced as Block 501 to 504. Each one is dedicated to the processing of the self-routing header according to the path being defined, as illustrated in FIG. 5.

Additionally, a set of four corresponding interface blocks, referred to as Receive_intf 1 (block 601), Receive_intf 2 (block 602), Receive_intf 3 (block 603) and Receive_intf 4 (block 604) provides the data, clock and frame synchro Fsync control signals from the interface between Bricks to the corresponding ATM-Receiver_Logic_Block. The interface can be either a classical connector with data bus and separate clock and frame synchro or an optical interface with appropriate logic in order to extract data, clock and frame synchro. An example of embodiment of an optical interface is hereinafter elaborated on with more details.

Similarly a set of 4 transmitting blocks—referred to as Xmit_Intf 1 (block 701), Xmit_lntf 2 (block 702), Xmit_lntf 3 (block 703), Xmit_lntf 4 (block 704), is provided in order to map the data bus coming out of each output ports of switch 200—Port output Port_1_OUT to Port_4_OUT—on switch 200. A clock signal is also provided on each of these interfaces 701–704. Generally, the clock signal is the same on each port and on each Brick. However the technology of switch 200 and mechanical or optical connection allows the handling of different speed on each interface. This is the reason why we are propagating the clock from and to each interface in order to reuse the same implementation with different clocks.

As we can see on FIG. 4, the process performed by this switching system is the following:

Let suppose that an ATM frame is coming from the UP interface. As mentioned above this frame comprises a routing header and an ATM data cell, the latter comprising a particular value of VP/VC which is assumed to be equal to 27/3. VP/VC is standing for both VPI and VCI address fields of the ATM cell as described above. It should be noticed that the routing header which is carried comprises n bits (n being equal to 8 in the preferred embodiment) which particular values are intended to change when the frame is successively transported from one Brick to the next one. This set of n bits are required to let each Intermediate Brick receiving the frame to compute a corresponding set of n bits forming a routing header which will be used for controlling the internal switch 200 located in the Brick. In the preferred embodiment of the invention the routing bits are computed by means of the the ATM_Receiver_Logic_Block and are then used for replacing the current value of the routing header. Once switched by switch 200, the frame including this routing header is conveyed to the next Brick. However, it should be noticed that once switched by Switch 200, it can be possible to use the routing header to transport other values that may be useful for the next Brick, for instance assigned to some local signalling or control functions.

As will be described below with many details, when an ATM session is requested to the Tower Manager by one station (i.e. one Brick) the latter assigns a particular Vp/Vc to this ATM session as well as a predetermined topographical routing path. This results in the loading into the Non Volatile RAM Storages that are located into the ATM_Receiver_Logic_Block of all the Bricks constituting the Tower Structure of the appropriate routing parameters, including the values of the routing bits which are needed for controlling the corresponding Switch 200. The particular NVRAM loading process is particularly described with many details with respect to the description of FIG. 7.

Let's suppose that the frame is received by Receive_intf_1 601 and sent to ATM_receiver_Logic_Block_1. Therefore, assuming that the Tower Manager has to load into NVRAM, contained into ATM_Receiver_Logic_Block1 the table according to which a VP/VC value of 27/3 should be routed through Port_3_Out of switch 200 in output. Therefore, Micro_controller 100 configures ATM_Receiver_Logic_Block1 501 thanks to an address bus 102, a data bus 101 and a cntl_bus 1 in order to let him modify, dynamically on the fly, the routing header in order to present the appropriate routing bits that will result in the frame being routed to port 3 of switch 200. The particular process that is used for achieving this result will be presented with details with respect to FIG. 5. Switch 200 which receives the frame at its Port_1_In uses the routing bits which are contained into the routing header and correspondingly performs the routing of the whole frame to the appropriate output port, that is to say Port_3_OUT. The frame is then conveyed to Xmit_lntf_3 703 and can then be transmitted to the next Brick of the routing path where a similar process is applied. Therefore, the ATM cell comprised into the frame can be successively conveyed between the different Bricks composing the appropriate routing path that was defined in accordance with the different routing tables that are located into each ATM_Receiver_Logic_Block of all the Bricks of the Tower Structure, and loaded under control of the Tower Manager. This is the function done by an intermediate node which will only forward input frames to the appropriate external output where the routing header will be set to a value that will switch the frame from one input ports to one output ports of switch 200.

A Brick can also be the sending point of a frame. A frame is composed of an ATM cell on which a routing header is added. In this case the routing header only needs one byte. However additional bytes could be envisaged in other embodiments. Additionally, if needed extra address fields can be added between this routing Header and the first byte of the ATM cell in order to extend to addressing capabilities. Let us consider the following example of a frame having a routing header of one byte which is followed by 53 bytes of the ATM cell which will compose a frame. The two first bytes of the ATM cell define the particular VP/VC values that are assigned to the particular ATM session between two existing Bricks in the structure. The frame is either received thru the ext_add_bus from the logical function of the Brick or can be prepared by the micro-controller 100, the latter being generally the case of control frames. This frame is stored in Dual_Port_RAM 400 and is then sent to the input of FIFO_IN 800 thanks to address_bus 102, data_bus 101 and cntl_bus_0 301. An interrupt int0 will be generated to micro-controller 100 in order to inform that a frame is ready to be sent. Micro-controller 100 will inform switch 200 to take the data on Port_0_IN as the output of FIFO_IN 800 is connected to Port_0_IN of switch 200. The switch will decode the header set on top of the ATM cell and will forward the frame to the appropriate output of switch 200.

The Brick beting at the ending point of the communication path has to receive and store the frame comprising the ATM cell. To achieve this the frame that comes from any input port 1–4 is forwarded to the input of FIFO_OUT 900. Then an interrupt int1 is generated to micro-controller 100 in order to prepare and activate a DMA transfer from FIFO_OUT 900 to Dual_Port_RAM 400 thanks to control_logic 300.

FIG. 5 shows the detailed design of one of the ATM_Receiver_Logic_Block.

The ATM receiver Logic Block is composed of several logical circuits based on a set of Registers used as a parallel shift registers a set of selectors, an NVRAM 530 which can also be a normal RAM and a state machine 500 which controls the real time flow of data and the initialisation of the NVRAM 530. This explain that two separate state machines will be later described in FIG. 6 and 7 to explain the various activities performed by the state machine.

Additionally all registers, latches and state machines are clocked by the clock that is received from the associated interface called CLK which is in fact a byte clock appearing at each byte of the frame. Any ATM_receiver_Logic_Block comprises a cascade of three parallel 8 bit registers 550, 560 and 570 which are designed to continuously store three consecutive bytes of the received frame. The two outputs of Register 550 and 560 are also used to form a 16 bits bus int_add_bus_0–15 whose 15 MSB bits (0–14) are connected to a first input bus of a selector 540, the latter having a second input which is connected to the address bus 102 of microcontroller 100. The last LSB bit (15) of int-add-bus-0-15 is connected to a SEL input of a SELECTOR×4 510 in order to select either the 4 LSB or 4 MSB data bits of the NVRAM. The output of Register 570 is connected to a first 8_bit input bus of a selector 580 having its output bus connected to a register 590. Register 590 has its output being directly connected to the Port_X_IN input of switch 200 (FIG. 4) where X is the number associated with the port being connected: 1 to 4. Selector 580 has a second input bus respectively comprising a set of four bits (bits 4–7 in the FIG.) which are forced to zero and a set of four additional bits which are provided at the output of a selector 510. Selector 540 and 580 are respectively controlled by a SEL1 and SEL2 control signal which are generated by means of a STATE_MACHINE 500. The output of Selector 540 is used for addressing a Non Volatile RAM storage 530 which data bus is connected to an 8-bit internal data bus 0–7. The latter is connected to a 3-state bidirectional driver 520 and is also divided in order to form a first 4-bit input bus (bit 4–7 on the FIG. 5) and a second 4-bit input bus (bit 0–3) of selector 510. Bidirectional driver 520 is controlled by STATE_MACHINE 500 by means of traditional DIR and Enable (ENA) control signals.

In the preferred embodiment of the invention only the 15 MSB bits of internal address bus are used for generating the address of the NVRAM storage. The 16th bit (bit 15) is used for controlling selector 510. This particular embodiment allows to take profit from the whole storage space of the 8-bit structure of NVRAM since only 4 bits are needed to form the routing bits needed for controlling switch 200 (which is a 16 input and output ports). However it should be noticed that other particular embodiments can be envisaged and such details are not necessary for the skilled man which would straightforwardly adapt the particular design to the requirements of the length of the routing header being used.

Register 570 has the particular purpose of delaying the frame a period necessary for extracting the appropriate routing bits from NVRAM 530 prior to the transmission of the ATM cell. When a frame is received the first three bytes are respectively stored into the cascade of registers 550, 560 and 570. More particularly when the first byte corresponding to the routing header used for controlled the last switch is stored into register 570, registers 550 and 570 appears to store the second and third bytes which corresponds to the 16 MSB bits of the VP/VC of the ATM frame. The latter are used to form the address carried on the Int_Add_bus_0-15 internal address bus, which 15 MSB are transmitted at the first input of selector 540, while bit 15 is used for controlling selector 510. Therefore as will be shown below with details, the VP/VC allows the addressing of the NVRAM storage in order to extract, on the internal data bus, the 4 bits that are necessary to control the switch 200 located in the considered Brick. These 4 bits which are extracted from the NVRAM will be incorporated into the routing header by means of selector 580 controlled by STATE_MACHINE 500.

Fsync control signal is transmitted to the input of STATE_MACHINE 500 and is used for initiating its processes as will shown below. Additional inputs to this state machine is the Control Bus from control logic 300 which contains following signals HALT, WR, RD, CS_NVRAM chip select signal.

Depending on the speed (CLK) value and the output delay of the NVRAM, the latching system should be adjusted and latches on SEL input of selector 510 and registers between register 570 and selector 580 can be added. The input 2 of selector 580 has its four Most Significant Bits forced to zero while the 4 Low Significant Bits are coming from the output of selector 510.

Figure 6:
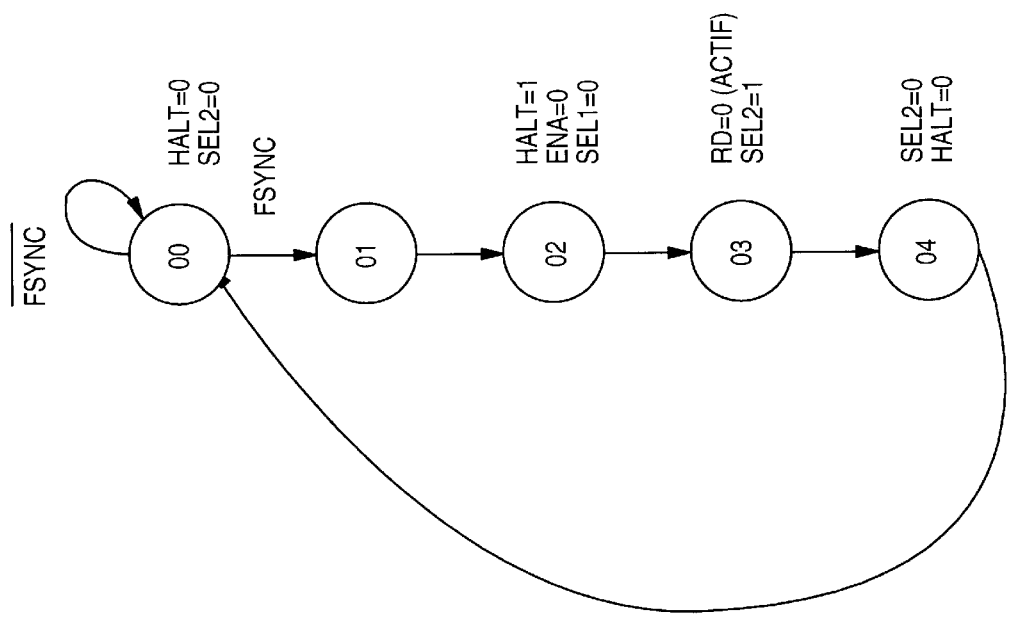
FIGS. 6 and 7 are flow charts respectively illustrating the first and second process of state machine 500 (FIG. 5).

FIG. 6 describes the first process which is involved by STATE_MACHINE 500 illustrated in FIG. 5. It corresponds to the real time process that is used for processing each frame being received by the elementary Brick.

The process initiates with state 00 where the process waits for the occurrence of FSYNC signal. In state 00, the HALT and SEL2 control signals are respectively set to a logical zero so that the first input of selector 580 is selected. This achieves the pass-through data mode where the data loaded into register 570 are transmitted to register 590.

On the occurrence of FSYNC signal the process proceeds to state 01 after one clock time.

On state 02, SEL and ENA signals are set to a logical zero, while HALT signal is set to a logical one. This results in the isolation of NVRAM from microcontroller 100 in order to prevent any access of the former by the latter. SELL is set to zero in order to select the first input bus of selector 540, thus presenting the VP/VC address located in the two registers 550 and 560 to the address bus of NVRAM storage 530. The process then proceeds to state 03.

In state 03, RD_NVRAM signal is a ctivated and SEL2 control signal is set to one so that the value of the new routing header that is extracted from NVRAM at the address presented at its address bus (being the VP/VC stored into registers 550 and 560 since SEL1 signal has been set to zero) can be selected by selector 580 and presented to register 590.

The process then proceeds with state 04 where SEL2 signal and HALT signal are set to zero. Therefore the selector 580 is controlled in order to select its first input (input 1) and let the ATM cell that follows the routing header be completely transmitted to switch 200. HALT signal is also set back to a logical zero so that the process can access the NVRAM for updating purpose if required.

The process then goes back to state 00 in order to achieve the processing of the following frame.

Figure 7:
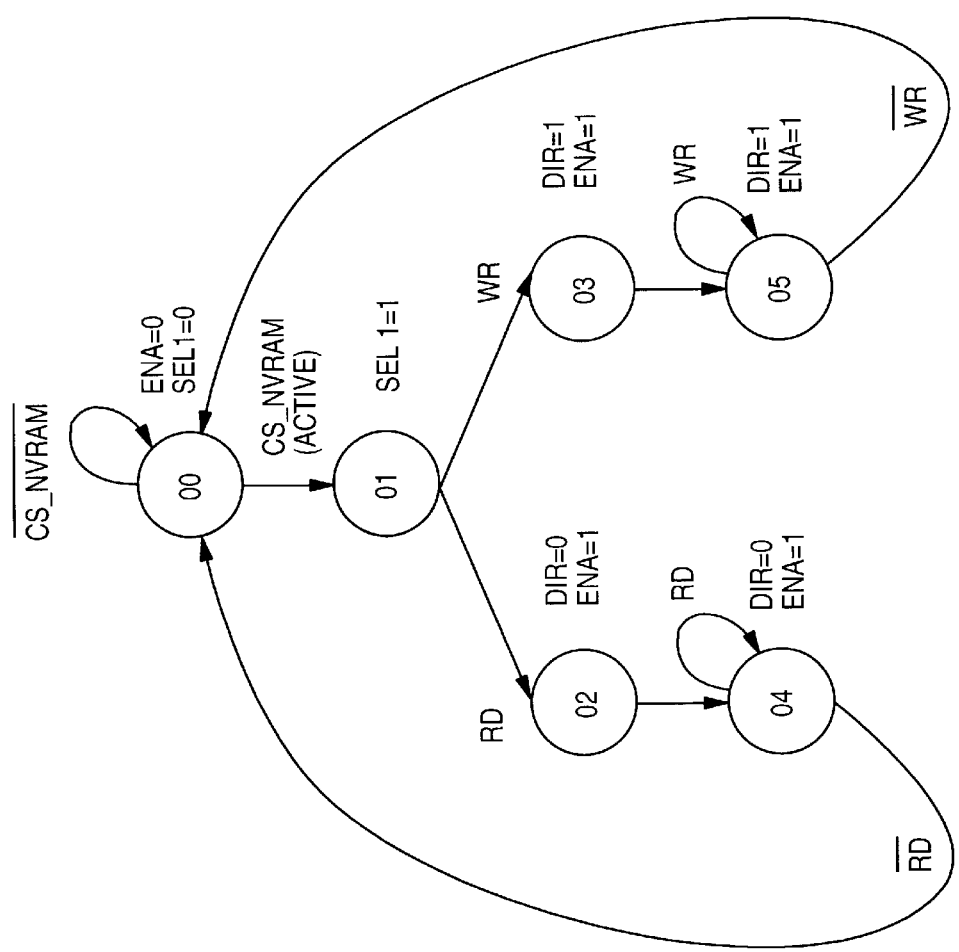

FIG. 7 illustrates the process of STATE_MACHINE 500 which achieves the handling of the access of NVRAM 530 by micro-controller 100.

The process starts in state 00 and loops on this state until CS_NVRAM signal is activated by micro-controller 100. In this state ENA and SEL1 control signals are set to a logical zero. Upon detection of CS_NVRAM control signal being active the process goes to state 01 where SEL1 control signal is set to a logical 1.

Upon detection of a RD read control signal generated by microcontroller 100 (on control bus 300) the process proceeds with state 02 where DIR control signal is set to zero and ENA Enable control signal is set to 1 in order to correctly set the 3-state_bidi_driver bidirectional driver 520 so that data that comes from Int_data_bus_0–7 internal data bus goes to data bus 101. The process then proceeds with state 04 where it waits for the RD control signal in order to complete. During this time DIR and ENA control signals are maintained to their previous values. The process proceeds then back to state 00.

Upon detection of a WR write control signal from microcontroller on state 01, the process proceeds with state 03 where DIR and ENA control signals are both set to a logical one. This allows data to be transferred from data_bus 101 to Int_data_bus 0–7 internal data bus in order to write data into NVRAM 530. This is particularly useful when microcontroller wishes to update the table loaded into NVRAM 530 by adding new values of VP/VC and new routing bits under control of Tower Manager as will be described hereinafter with details. The process then proceeds with state 05 where STATE_MACHINE 500 waits for the end of the write operation. Upon detection of WR signal being inactive, the process proceeds back to state 00.

Figure 8:
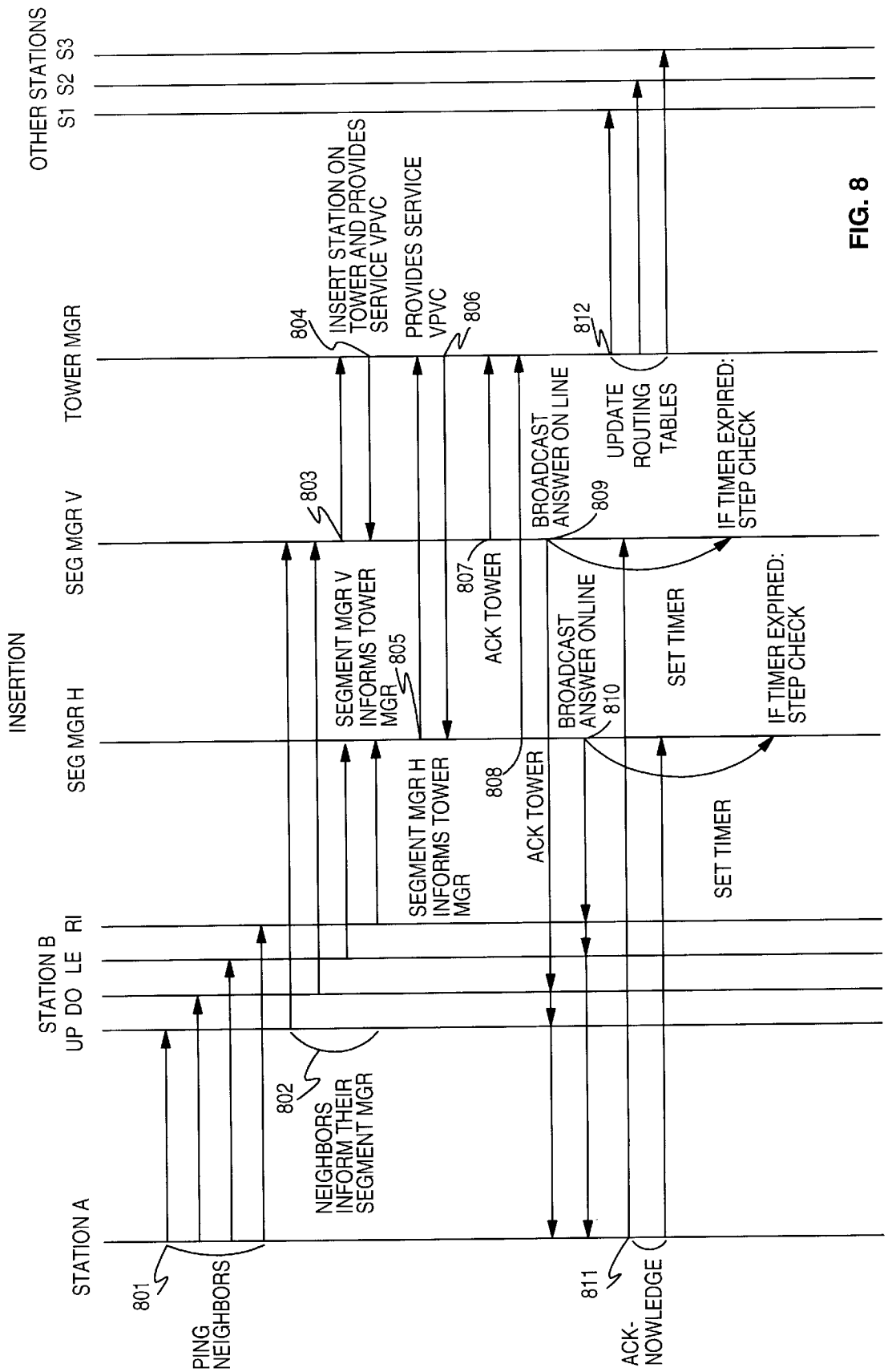
FIG. 8 is a communication flow chart illustrating the procedure involved for achieving the insertion of a new Brick into the Tower structure in accordance with the present invention.

FIG. 8 illustrates a communication flow that shows the process being performed for achieving the insertion of a new Brick into the Tower Structure.

When a Brick is inserted into the Tower Structure, Station_A for instance representing the telecommunication functional part of the Brick, the latter is subject of a registration procedure under control of a particular Brick having the role of the general Tower Managing function.

Once the Brick is mechanically plugged and the telecommunication transmission and receiving Blocks 501–504 and 701–704 of FIG. 4 become operation, the Registration procedure can be initiated. The latter begins by the transmission of a frame having a specific VP/VC characterizing the Registration request, being for instance 99/0. This frame is transmitted to the four Xmit_Int_1 blocks 701–704 that is to say in the four possible directions, step 801 of FIG. 8. Any station receiving this Registration frame decodes the VP/VC and intercept it. Since the newly plugged station may have from 1 to 4 distinctive neighbours, a set of 1 to 4 corresponding processes will be initiated into the possibly connected neighbouring stations. Every station that receives the Registration request on its UP or DOWN Receive interface 601 or 602 proceeds with the transmission of the request to its associated vertical Segment Manager Brick. Conversely every station that receives the Registration request on its LEFT or RIGHT Receive Interface 603 or 604 proceeds with the transmission of the request to its associated horizontal Segment Manager Brick, as represented by step 802 of FIG. 8.

A Segment Manager, either Horizontal or Vertical, is defined to be a station that provides controls of a full line or column of the Tower Structure. In the preferred embodiment of the invention the Segment Manager is defined to be by convention the oldest installed Brick into the considered line or column of the Tower Structure. As will be described below, each Segment Manager operates as an intermediate control point between each Station belonging to the line or column, under full supervision of the general Tower Manager.

This convention allows the possibility to dynamically enhance the power of the Tower Structure by plugging new stations. The process uses the existence of the Tower Manager and Segment Manager to control the new installations after power-on of the entire structure. If the installation of the Tower Structure starts with several elements at the same time, without pre-stored configuration, the role of the segment Manager and Tower Manager is, by convention, assigned to Bricks located at the bottom left in order to avoid conflict for Segment Manager and Tower Manager allocation. In any cases, several recovery procedures will be described with details with respect to FIGS. 11 and 12.

Although one Segment Manager appears to be by default the oldest Brick in the considered line or column, the structure according to the present invention provides with the possibility of reassignment of this controlling function to any different Brick of the segment considered. This is particularly useful when the tower tend to a great size with Bricks having functions that are used by many other Bricks in the Structure. In this case, it can occur that one particular functional Brick, operating as a Segment Manager, is overloaded by its other functional routines. On request from the Segment Manager that becomes overloaded, the Tower Manager has the possibility of reassigning the function of Segment Manager to a different Brick in the considered Segment, the latter being assumed to have some digital computing resources available.

The Registration procedure then follows with the forwarding of the Registration requests by 803 and 805 Segment Managers to the general Tower Manager. Therefore, the latter is made aware of the particular topographical position of the newly installed station. In accordance with the VP/VC that are already assigned to the different ATM sessions that are used between the different stations of the Tower Structure, the Tower Manager can define a new service VP/VC that is assigned to the newly plugged station. The Tower Manager can then inform the one or two Segment Manager(s) of the newly value of VP/VC that was assigned to the new station, on steps 804 and 806.

Additionally, the message transmitted by the Tower Manager to the two Segment Manager further contains all necessary address and parameters to be used by the new station: for example, its includes also the Vp/Vc specific of the two Segment Managers for station A.

The Tower will also send a control service message by means of an appropriate ATM cell to all the Bricks that have to update their routing table in order to correctly route all these new calls on step 812. This service message will then be forwarded and broadcasted by each Segment Manager on each line to inform all neighbors of the new station that the request has been treated as defined on steps 809 and 810 In addition, on step 807 and 808, each Segment Manager will acknowledge the reception of this service frame by answering to the Tower Manager.

Each station is then made aware of the specific communication identity number of the newly inserted station. As this message will use also a predefined Vp/Vc value for example 99/99, the new Brick will store by default this frame, like all other station as 99/99 means broadcast. Now station A is able to contact directly the two Segment Managers and the Tower Manager directly using all given Vp/Vc. Station A will then acknowledge the reception of the service frame to both Segment Managers to complete the process thru step 811. The two Segment Managers then wait for this acknowledge. If no answer occurs, following a time out, a recovery procedure using alert calls will be performed as described in FIG. 11. Anyway on all steps of this procedure, several backup or duplicate calls are done thru different way to in sure an acceptable reliability.

Figure 9:
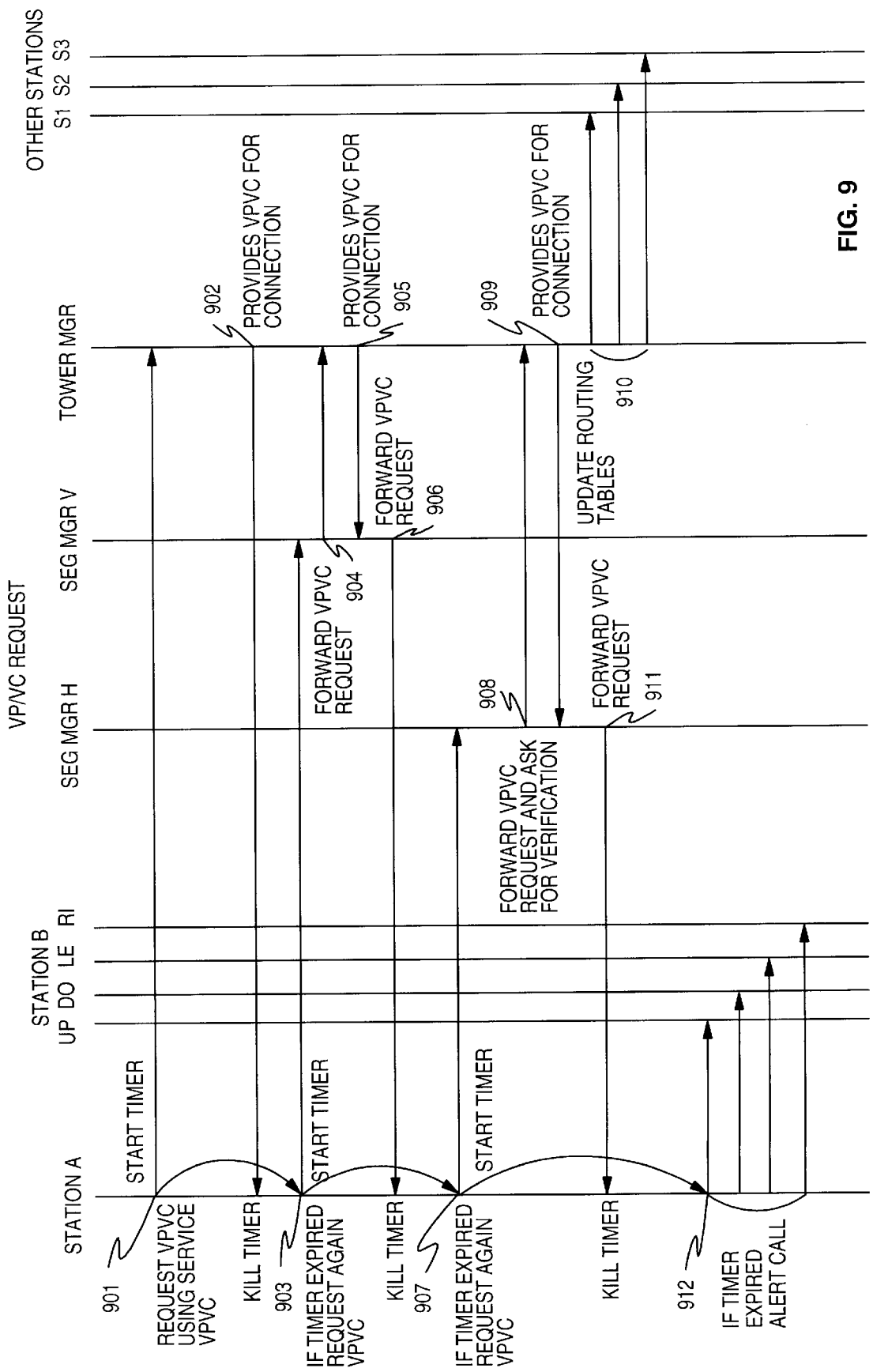
FIG. 9 is a communication flow chart showing the management of the Vp/Vc request by the Tower Manager.

FIG. 9 shows the Vp/Vc request flow between a Brick and the Tower Manager Brick in order to get a VP/VC for the connection.

Assuming that a new call has to be established between Station A and Station B in the Tower, a new Vp/Vc has to be assigned by the Tower Manager for this new call. In order to achieve this a process is performed that starts on step 901 by sending a Vp/Vc request to Tower Manager, using the service Vp/Vc given by the Tower Manager on the previous process described in FIG. 8. A timer is parallely initiated to run possible recovery procedures if no answer from the Tower Manager appears to occur. On step 902, the Tower Manager answers to the Requester (station A) by providing it with a new Vp/Vc for the requested call. It should be noticed that the Vp/Vc value and path may be different for the sending and receiving data flows. Accordingly all the necessary stations will be updated with the new routing parameters needed for this new call, as shown on step 910. The answer from the Tower Manager also entails the stopping of the above mentioned recovery timer.

If no answer is received by the station after a predefined time, the station will try to process the request thru the Vertical Segment Manager on step 903, and will inform it about the previous failure. On step 904, the above mentioned Segment Manager will forward the call to the tower Manager. The Tower Manager, on step 905 should answer with the requested Vp/Vc and should proceed to a verification about the above failure. On step 906, the Segment Manager which forwarded the request to the Tower Manager, now forwards the answer to Station A. If no answer is received by station A after the expiration of the period defined by the timer initiated, a similar request is then generated thru the Horizontal Segment Manager as described on steps 907, 908, 909 and 911.

If no answer does occur at all, this indicates that no way is available in order to communicate with the Tower Manager. In this case a general alert call 912 is generated to all neighbors resulting in a global step by step recovery procedure which will be described with more details with respect to FIGS. 11 and 12.

Figure 10:
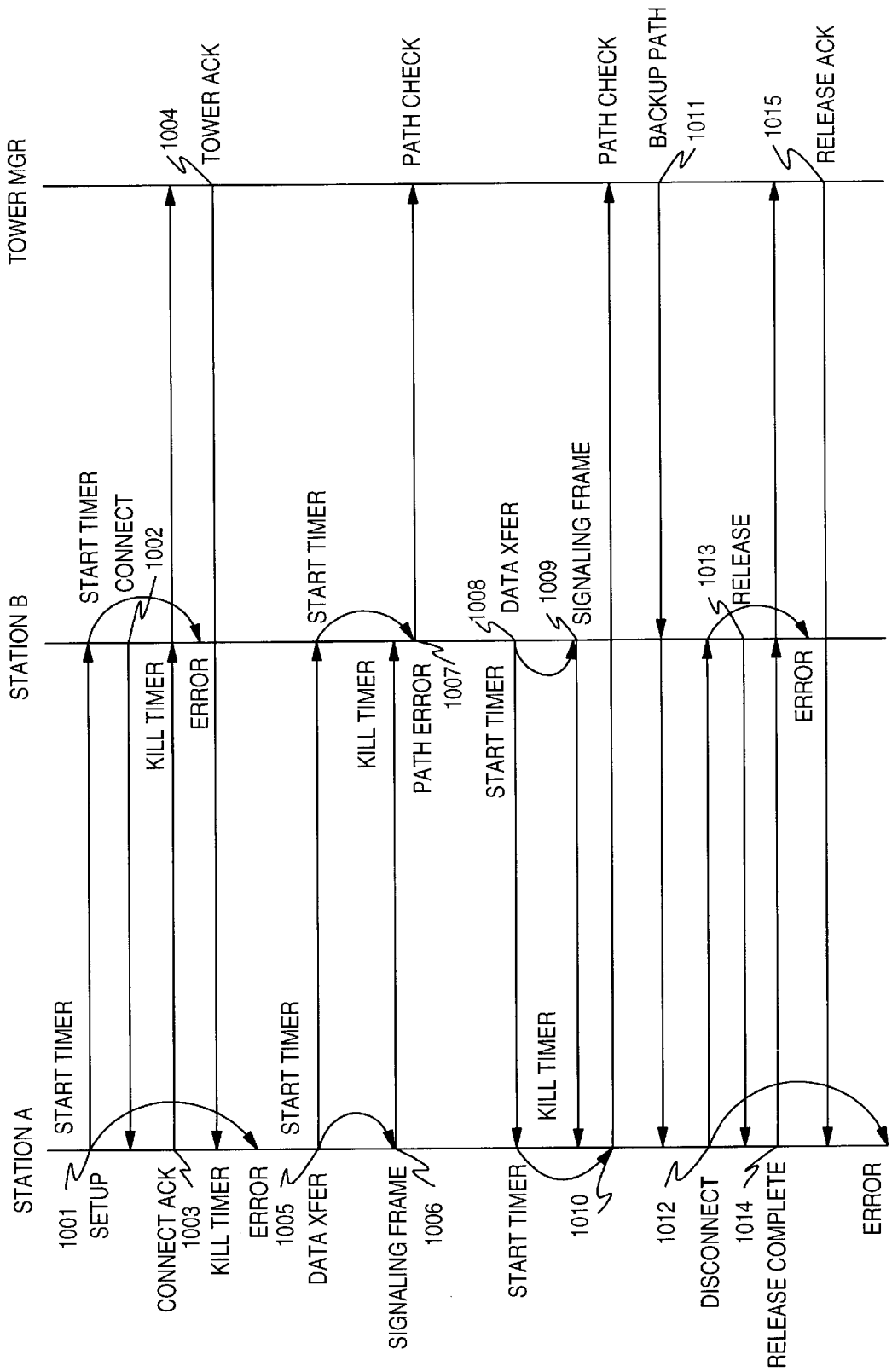
FIG. 10 illustrates the setup, data transfer and disconnection procedures in the Tower structure in order to allow secure data transfer between two bricks.

FIG. 10 illustrates the setup, data transfer and disconnection procedures between two Bricks in the tower to allow secure data transfer.

Assuming that the Tower Manager has assigned a determined Vp/Vc for a call which appears available, a setup procedure is activated according to step 1001. At the same time, a timer is set for error checking and retry procedures. On this step, a setup frame is sent from Station A to Station B. Station B will answer, on step 1002 by a so-called Connect frame. Similarly a timer is set on Station B for error checking procedures. Station A then sent back a Connect Acknowledge frame to Station B on step 1003. This Acknowledge Frame is also sent to the Tower Manager to inform it about the new incoming traffic, for statistics, flow control and Call management purposes. To be sure that this has been correctly performed, the Tower Manager sends a Tower Acknowledge to Station A on step 1004. Upon reception of the latter, Station A stops the running of the error recovery procedures timer. In case of error, recovery procedures thru alert calls will start as described in the two next figures.

When the Setup procedure is completed, Station A may start the data transfer between Station A and Station B. Data transfer management of transmit and receive side are separated as they can be run asynchronously, at different speed and on different paths. Each transmit side will run the same control process, same for each receive side. At this level the process is symmetrical, which is not the case for the setup or disconnect procedures. The transfer from Station A to Station B starts on step 1005. At each data frame sent a timer is set and is reset at each frame on both Stations A and B. The Station B timer is chosen to be slightly longer than the timer of Station A to take in account the transmission delay. If on station A, no data are available to be transmitted within the defined timer, a signaling frame is sent when the timer expired, in order to avoid Station B timer to expire, with reference to step 1006. As previously explained, this signaling frame may also transport some useful information about status, controls or statistics. On the side of Station B, if no data frame nor signaling frame appears to be received within the timer delay, a PATH_ERROR frame is generated on step 1007 to the Tower Manager which will perform a PATH_CHECK on the Tower. This results in the definition of a new route or path for the call. The, the Tower Manager informs the two Station A and B that the problem was solved by means of the BACKUP PATH message on step 1011.

Similarly, for the part of the call where data are sent from Station B to Station A steps 1008, 1009 and 1010 are running the same process which may lead, in case of error to step 1011.

When the call procedure is completed, a disconnection is needed which can be started either from Station A or Station B. Let us assume that Station A starts the disconnection. On step 1012, a disconnect message is then sent to Station B. On both side, a timer is started for error recovery procedures. Upon detection of this message, and possibly checking with the end user application, a Release frame is sent back on step 1013 to Station A. The latter will reply on step 1014 to Station B with a Release Complete which is also sent to the Tower Manager in order to free the Vp/Vc, associated reservations traffic parameters. On Station B this frame will stop the timer to avoid the initiation of automatic error recovery procedures. The process is then completed, on step 1015, by Tower Manager which sends a Release Acknowledge to Station A. This message will also result in the stopping of the error recovery procedure timer in Station A. If the case where no answer is received leading in a timeout, a Error is logged and error procedures are turned on.

Figure 11:
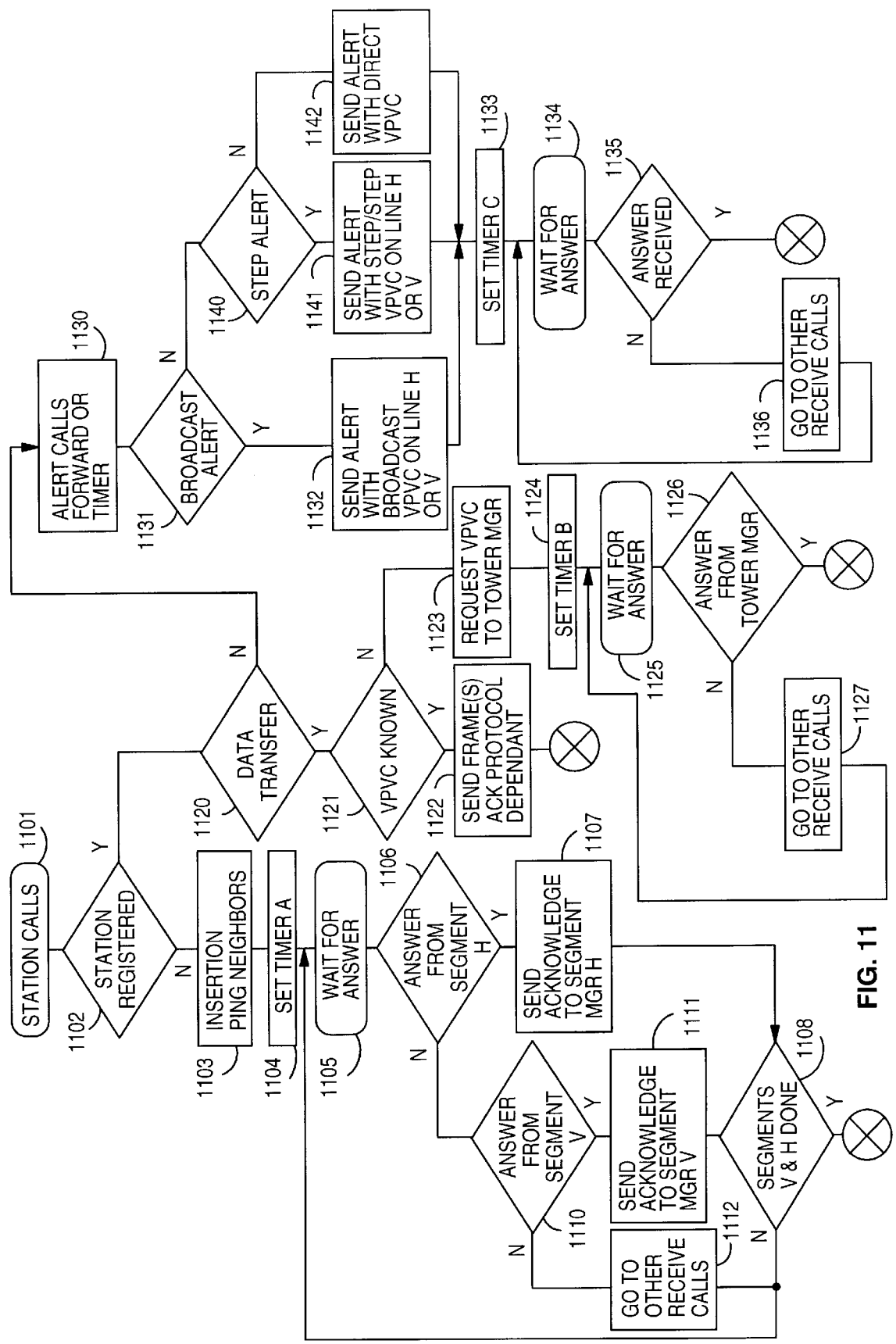
FIG. 11 is a general flow chart illustrating all possible calls that can occur from a station or a Brick.

FIG. 11 is a flow chart showing all possible calls from a station or Brick including recovery procedures.

When a station wants to call another station, step 1101, it first checks if it is registered on step 1102. If the answer is no, the procedure described in FIG. 8 will be run starting by a ping neighbors on step 1103.

On step 1104 a timer is set for possible error procedures which may let the process go to step 1130 if the timer expired. After having ping the neighbors, the station will on step 1105 wait for an answer on broadcast Vp/Vc which are predefined, any value being possible. ITU or ATM Forum reserved values for other purposes are obviously not to be used. When a frame is received, step 1106, the process involves a checking in order to determine whether the frame comes from the Horizontal Segment Manager and whether it corresponds to the answer for the insertion. In this case, the process then goes to step 1107 and an Acknowledgment is sent to the Horizontal Segment Manager.

The process then goes to step 1108 where a checking is performed to verify that an answer has been received thru both Segment Managers. If it is not the case, the process goes back to step 1105. If it is the case, the process is completed.

On step 1106, if the call received is not the answer from the Horizontal Segment Manager, the process goes to step 1110 where a checking is performed to verify if the call is the answer coming from the Vertical Segment Manager. If yes, the process goes to step 1111 where an Acknowledgment frame is sent to the Vertical Segment Manager and then to step 1108 already described. If no, the process goes to step 1112 before going back to step 1105.

Figure 12:
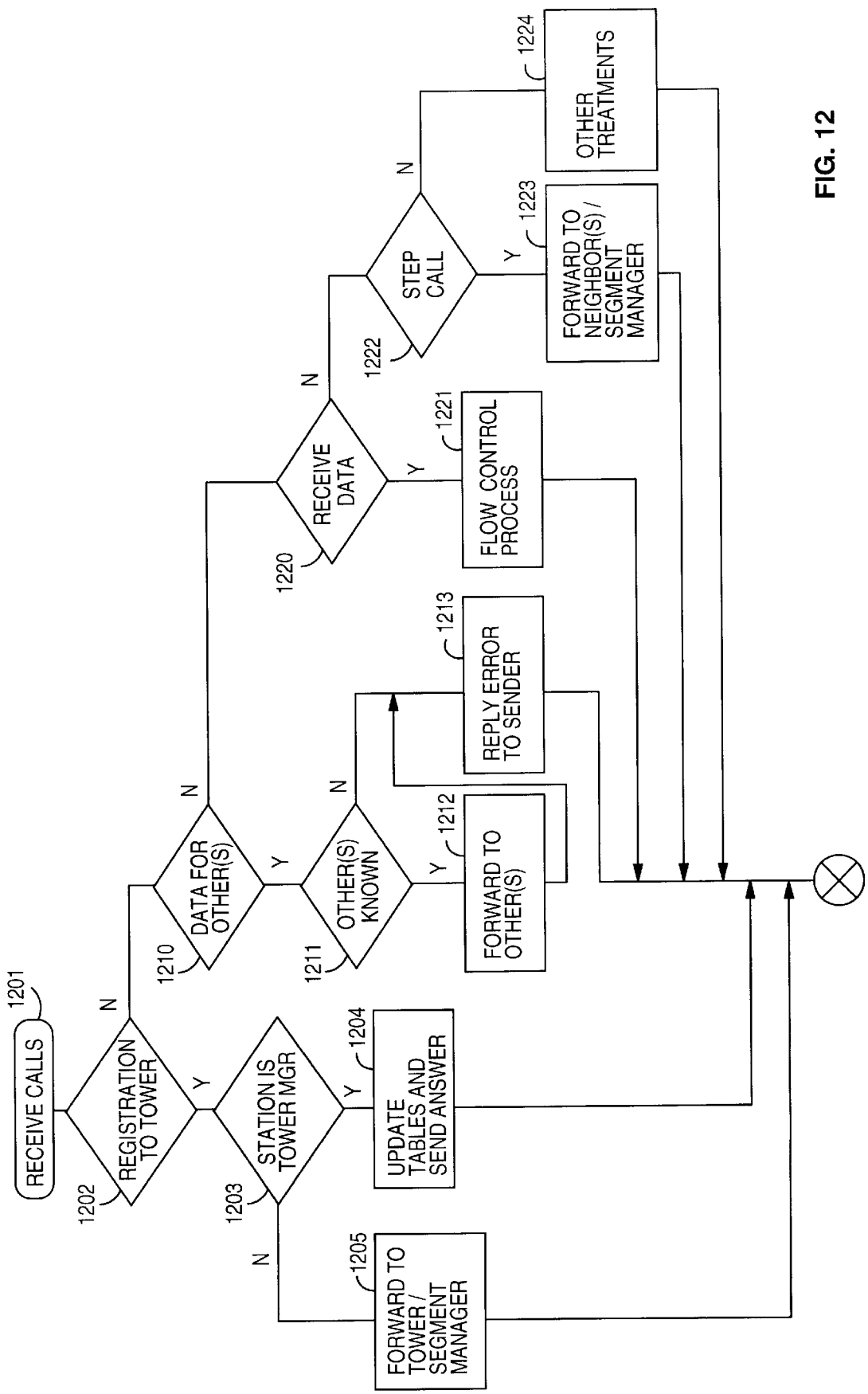
FIG. 12 illustrates the processes that a station has to follow upon reception of a call.

Step 1112 is the general receive call treatment also described in FIG. 12 with reference 1201.

On step 1102, if the answer appears to be yes, thus indicating that the station has been defined in the tower, the process proceeds with step 1120 where a test is performed in order to check if the call is for a data transfer or for an alert call. All normal signaling procedures are considered as data transfer even if this type of call is permanent and does not need to pass thru a setup and disconnection process like normal data calls. In the latter step if its a general data transfer type of call, the process goes to step 1121 where it is verified that a Vp/Vc is available for that call. In the positive case, the process goes to step 1122 where data can be sent. It may correspond to the procedure described on FIG. 10 or any other kind of data transfer protocol. Conversely, in the negative case, the process proceeds with step 1123 where a Vp/Vc is requested to the Tower Manager according to the process described in FIG. 9. Then a timer B is set on step 1124, for error recovery procedures. The station waits for the answer from the Tower Manager on step 1125. If the answer is received on step 1126, the process is finished. In the reverse case, the process goes to step 1127 to check if another treatment on the received frame has to be done and then go back to step 1125 in order to wait for the awaited message. If the timer B expired, indicating that something has failed, the process goes to step 1130.

Step 1130 is the entry point for all alert calls which can be either originating by the present station, or being calls received by other stations and that should be forwarded or alert due to expired timers. Three kinds of alert may be generated and will be described hereunder.

When an alert is found, the process goes from step 1130 to step 1131 in order to identify if the alert is a broadcast alert. In this case the process proceeds with step 1132 where the alert frame built by the control process of the station is sent on both vertical and horizontal lines, both ways corresponding to the four possible external connections of the Brick. All Bricks and included stations will receive the alert message as the Vp/Vc used is 99/99. 99/99 being for example the Vp/Vc reserved for such broadcast messages. Each station routing table is always set to store this kind of message and micro-controller 100 always forwards this kind of message to the next brick on the line. Either this message is lost as a station on the line is not present or down, or the sending station will intercept this message, if looped back in order to avoid to saturate the network. If a sending station receives this broadcast message back, it means that all stations on the line are present. This does not mean that they are working correctly as the message is just passing thru the switching function of each Brick. Anyway, each station should store this kind of message and generally has to forward it to its own Segment Managers. This kind of message will generally be used when direct communication to either Segment Managers or Tower Manager is down. When this is done, the process goes to step 1133 where a timer TIMER C is set in order to process another type of alert call if no answer to the previous alert call is received. Then the process waits for an answer on step 1134, until the reception of an answer which will be checked to be the answer to the alert message on step 1135. If not the process goes to step 1136 in order to process the received message and then will go back to wait for the answer on step 1134. If the expected answer is received on step 1135, the process is completed.

A similar process is followed for the other types of alert. On step 1131, when the alert appears to be not a broadcast alert, the process proceeds with step 1140 in order to determine if the alert is of the type Step alert. In this case a step by step alert is generated either on the vertical or the horizontal line with the appropriate Vp/Vc, for example 99/0. Each neighbor on the line will intercept this call and forward it if possible to the line Station Manager. In case of no answer, the latter station can also generate a step alert 1141 to its neighbor. Then the process goes to step 1133 which was described above. If, on step 1140, the alert is not a step alert, the Vp/Vc should be given by the upper layer, generally corresponding to a Segment Manager or the Tower Manager. The process continues on step 1142 where the alert message is sent with the given Vp/Vc to a single destination. Then, the same process starting from step 1133 is followed.

FIG. 12 describes all processes that a station may have to follow upon reception of a call.

When a call is received on step 1201, the station check the type of call on steps 1202, 1210, 1221 and 1222:

If the call is a tower registration the process goes to step 1203. If the call is a forward data the process goes to step 1210. If the call is a receive data the process goes to step 1220. If the call is a step call the process goes to step 1223. Additional functions can be implemented for other calls, in step 1224.

In case of registration, the process on step 1203 checks if the current station is the Tower Manager. If YES, on step 1204, the station will update its tables and send answer to any station involved. If NO, the process goes to step 1205 where the message is forwarded to the Tower Manager or Segment Manager. At that time the current process is ended. The detailed process is described in FIG. 8.

In case of data received which should not be for this station, the process, on step 1211, checks if the the destination is known and will forward the message on step 1212. Anyway, an error message is sent back to the originator if known or to the Tower Manager on step 1213 in order to correct the problem. Then the process completes.

In case of receive data, which is the normal case, the process goes from step 1220 to step 1221 where the appropriate flow control process agreed between both station is turned on.

In case of step call, on step 1222, the process has only to forward this message either to the Station Manager or neighbors if no answer.

Figure 13:
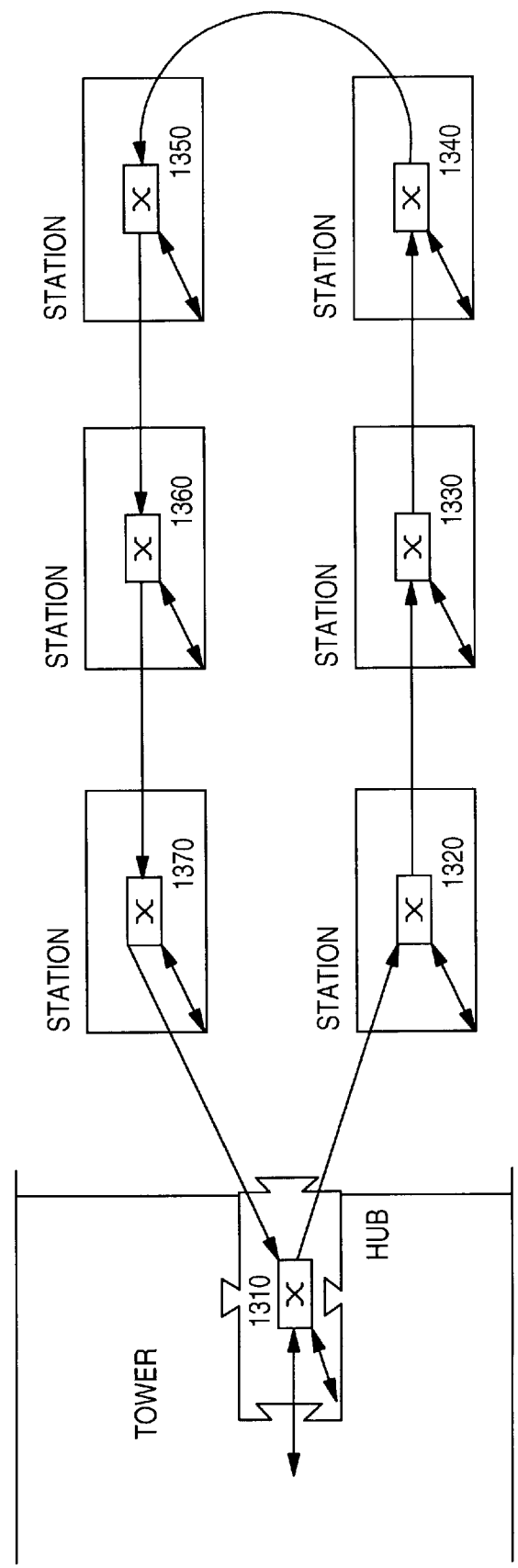
FIG. 13 illustrates a particular implementation of the present invention in order to provide a Switch Ring.

FIG. 13 Is the implementation of the previous concepts in order to build a Switched Ring using a simplified structure.

It is possible to extend the Tower concept of this invention to embody a ring topology where each station may be located in different locations, which are connected with the same type of link existing within the Tower. In that case, the mechanical brick structure appears no longer necessary as no mechanical link is needed. The Tower Area Network is only logically implemented. Furthermore, the complexity of five interfaces for each station is not required. A minimum configuration of 2 interfaces is enough for a half-duplex ring: one interface being used for the ring and one for the internal connection. Generally a 3 interfaces box seems better as it can offer a full-duplex LAN connection. As an example, a set of 6 boxes (1320, 1330, 1340, 1350, 1360, 1370) is interconnected in half-duplex mode to a Hub Brick 1310 belonging to a Tower on FIG. 13.

In the above case where the vertical topology and specific control devices such as Vertical Segment Manager have disappeared, the control process may be simplified and will only used the Horizontal Segment Manager. If the above LAN structure continues to be attached to a Tower, the Tower Manager can handle this LAN. If this kind of LAN is built stand alone or has no connection to a Tower, a simplified LAN Manager may be defined including both functions of a Segment Manager and a Tower Manager. This LAN may be attached to any kind of switching Hub.

Figure 14:
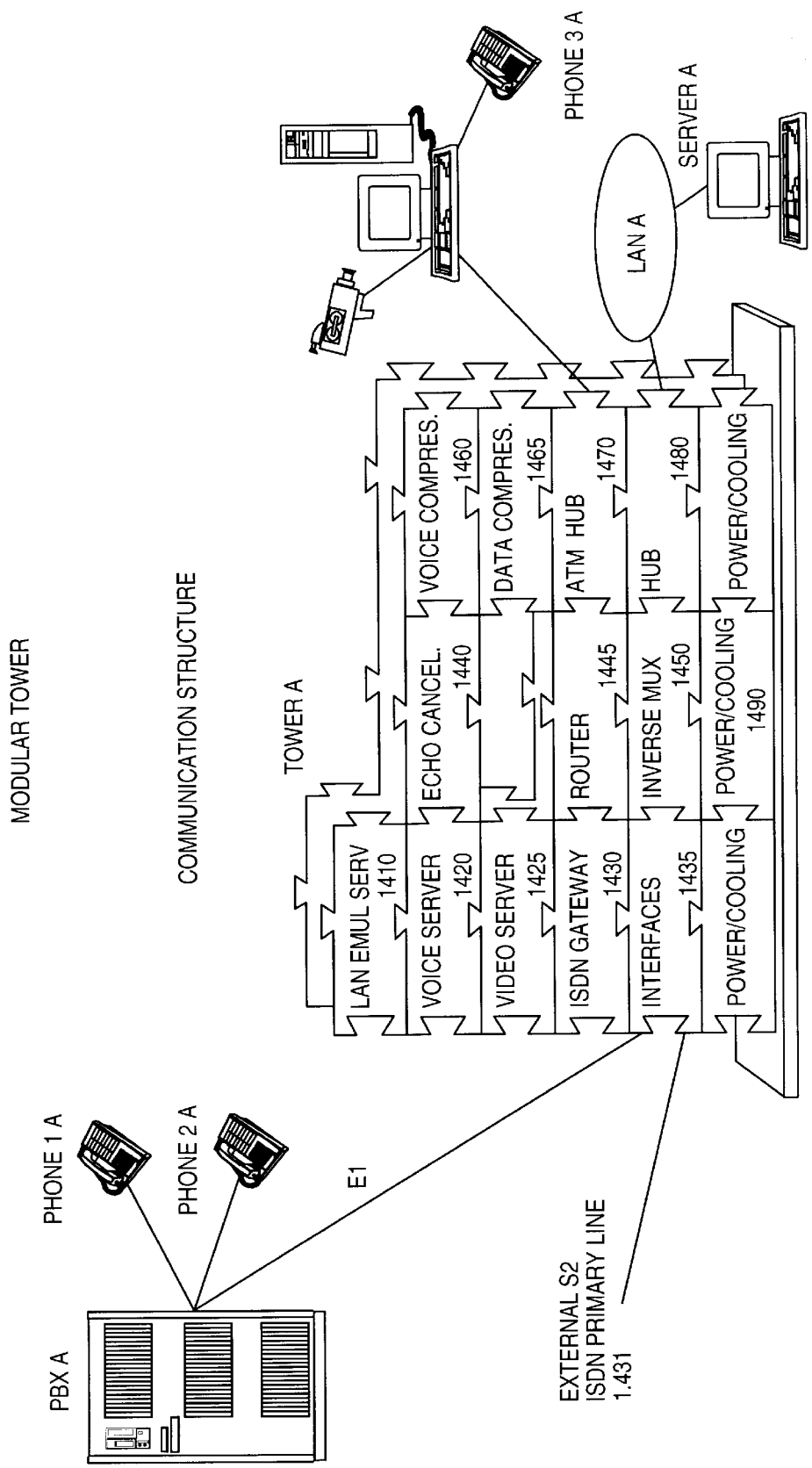
FIG. 14 shows a typical utilization of the communication Tower structure in accordance to the present invention.

FIG. 14 illustrates a typical utilization of the communication structure in accordance with the present invention. In the figure, a multimedia ATM station A is connected to the apparatus of the invention via a ATM hub brick 1470 that performs the attachment and multiplexing of several ATM stations. A Private Broad Exchange (PBX) device is connected to a dedicated interface 1435 that embodies the G.703/G.704 CCITT recommendations. In addition the protocol that will run on channel number 16 is, a known in the data communication art, a so-called QSIG protocol. As it appears on the figure, PBX device A is attached with two phones 1A and 2A. A server A station is connected to a shared media Local Area Network (LAN), such as ethernet, token-ring or FDDI, which is also attached to a Hub brick 1480 which also carries out the multiplexing and physical control of the attached LAN.

The communication structure represented in FIG. 14 is also attached to a not shown external network via a Integrated Services Digital Network (I.S.D.N.) link through the Interface brick 1435. In order to achieve this, interface brick 1435 has to comply with the I.431 CCITT recommendations defining the physical layer requirements.

In addition interface brick 1435 and Hub Brick 1480 will include the ATM Adaptation Layer (AAL) in order to map all non ATM protocol to ATM cell. The various possible adaptations are defined by the ITU-T. In particular, interface brick 1435 will at least perform all Segmentation and Reassembly functions (SAR) allowing each input flow to be transported in the Tower on ATM cells. Each function of the tower may then handle the flow either as ATM cell, or may perform the symmetrical SAR function in order to work with the original flow. The choice depends mainly on the type of function performed on each brick.

The OSI level 2 and 3 layers (known under the reference Q.921 and Q.931) is handled by the ISDN gateway brick 1430 which, therefore, will provide the necessary functions and procedures to establish an internal ISON or QSIG call or, still, for establishing a call for ISDN external links. It should be noticed that any device (either an internal brick or station A for instance) may request and initiate such a call thanks to ISDN gateway 1430.

Additionally, the communication structure includes a set of several bricks which will be used for the sake of the explanation. A LAN emulation server 1410 is used for establishing a link between native ATM station A. LAN emulation server handles the connection between a switched ATM environment mode and a connection-less environment such as shared media LAN A in order to establish a call between station A and server A. In the prior system it should be noticed that this function is embodied by a specific box that is attached to both the LAN and the ATM hub. In this invention, a brick is advantageously used for embodying these functions.

A voice server 1420 is used to communicate between one of the phones (phones 1A or 2A) that are attached to the PBX A, and a phone (phone 3A) that is attached to station A, or still, LAN attached telephones (not represented). Phone server 1420 achieves all call setup facilities that are ordinarily used in a PBX environment and may be also used to establish calls through the ISDN gateway.

The Video server functions are embodied in a specific brick 1425 which performs, for instance, H.261 compression or MPEG compression or other compression algorithms. This Video server 1425 may also establish external calls thanks to the ISDN gateway 1430 and, optionally, may use the functions of an Inverse Multiplexor brick 1450 in order to aggregate several ISDN B channels, thus providing a channel having more than 64 kbps throughput, such as H.320 CCITT recommendations.

The voice capabilities of the communication structure generally implies the use of an echo canceller that, in the present invention, is dedicated into a specific brick 1440. As will appear hereinafter with greater details, echo canceller provides the functions that are needed for extracting and cancelling the effects of the echo that is inevitably introduced by the use of hybrids that exist in the telephone sets and PBXs.

A router 1445 is used for achieving either the functions of bridging and routing that are necessary to map, for instance, 802.2 LAN protocols to TCP/IP internet protocol.

Voice compression functions are embodied into a brick 1460 that perform voice call compressions. Analog voice calls are generally digitalized using well-known PCM methods to 64 kpbs. Available compression rates extend from 2.4 kbps to 32 kbps. As will be shown hereinafter, the voice compression functions may be used either for phone calls that come from the PBX or, still, calls coming from any station, e.g. station A in the figure.

Data compression functions are embodied by use of a dedicated brick 1465 that runs compression algorithms such as MNP, or V.42bis or Ziv-Lempel types of algorithms. Such data compression functions may be used for direct calls between stations, e.g. station A and a corresponding other station (not represented) that is communicating through the ISDN link, or on the trunk side of the router that is connected to the external network.

At last, a set of power cooling bricks 1490 are user for providing a mechanical basement for the communicating structure, as well as voltage supplying for the different bricks that compose the communication structure of the present invention. Additionally a set of fans is provided into bricks 1490 for pulsing and cooling the different bricks existing above the power/cooling brick 1490. It should be noticed that the invention is designed to operate with additional cooling devices that also take the form of a specific brick that can be located anywhere in the structure, for instance in an empty location or on top of one column of the structure.

Hereinafter are described some typical communication situations which illustrates both the operation of the invention and the advantages that are provided from the arrangement of the different ATM functional bricks.

Figure 15:
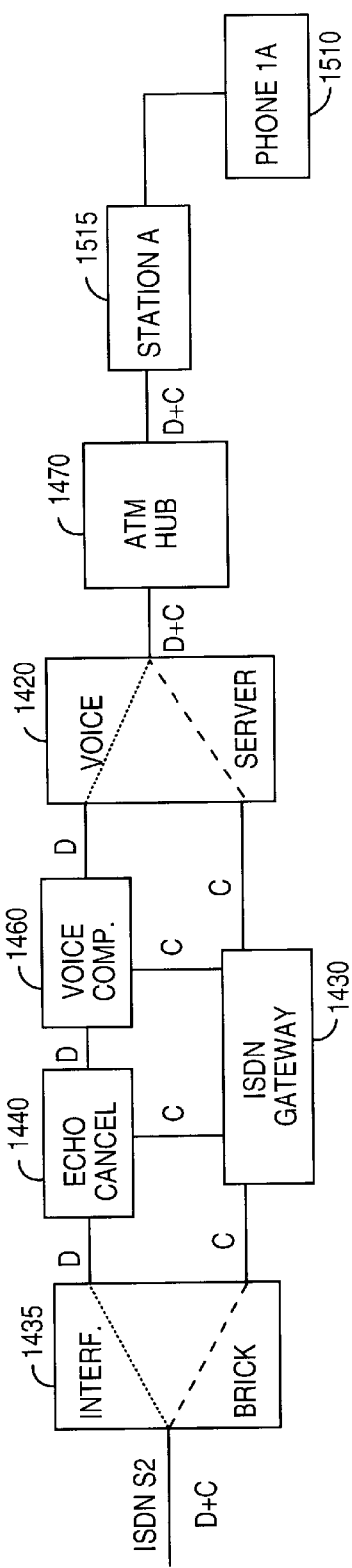
FIG. 15A represents a logical flow chart illustrating the processing of a call from one phone being attached to an ATM station.
FIG. 15B illustrates the processing of a phone call from phone 2A that is attached to a PBX.
Figure 15:
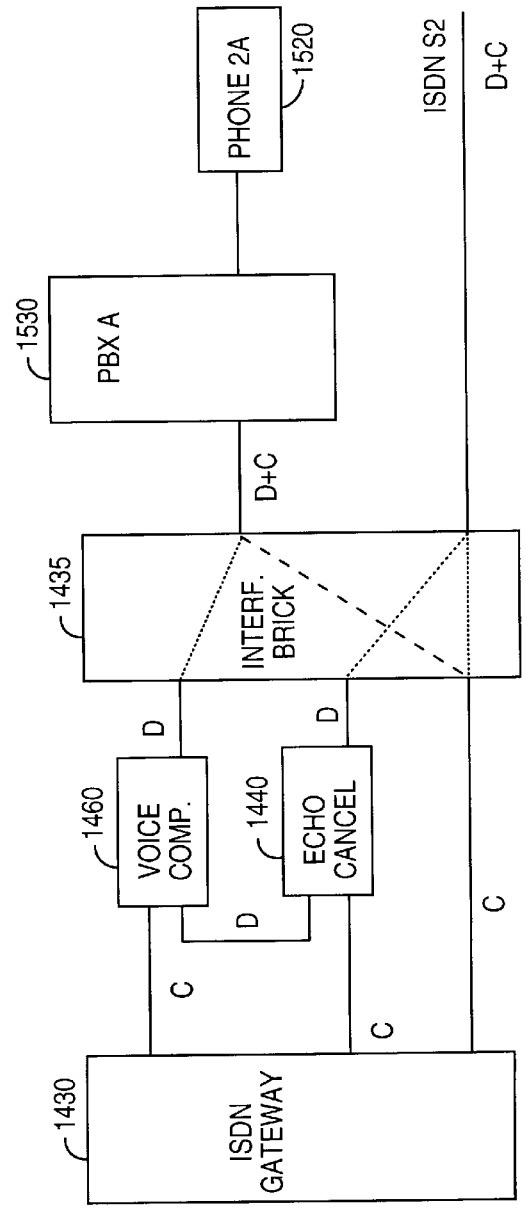

FIG. 15 A represents a logical flow chart illustrating the processing of a call from one phone (A 1510) that is attached to ATM station A, the call being output to the external ISDN primary line that is attached to Interface brick 1435. As known in the art, such a situation involves the performance of three essential phases: a first connection setup phase, a data communication phase, then ended by the disconnection phase. As will be shown hereinafter, the three phases involve the establishment of a set of ATM communication sessions between some bricks in the communication structure of the invention, each communication session involving the generation and transmission of at least one ATM cell.

The first phase is the connection setup phase. Basically, in addition to the general ATM Tower management sessions that are required between any brick and tower management brick 24, the connection setup phase involves a set of particular ATM control sessions, including the establishment of a first ATM control session between station A 1515 and voice server 1420; a second ATM control session between voice server 1420 and ISDN gateway 1430; a third session between ISDN gateway 1430 and Interface brick 1435; a fourth session between ISDN gateway 1430 and echo canceller 1440; a fifth session between ISDN gateway 1430 and voice compression brick 1460. It should be noticed that, possibly, additional sessions can be contemplated, e.g. a particular session involving a encryption server brick or still an error correction detection brick that are not represented in the figure.

It should be noticed that this call being communicated through the ISDN external network could lead to the establishment of a communication session with either a (not represented) telephone set attached to an ATM station or a phone that is connected to a PBX. If the other party is capable of using the same data compression mechanism that is embodied in brick 1465, then the session may use such a compression algorithm. In the reverse case, the session will be establish without the use of compression.

The first session is established between station A and voice server 1420 through ATM hub 1470, particularly upon detection of hook-off and the dialing procedure performed by the phone attached to station A. This first session starts with a call which particularly defines the parameters that will be used for the communication, among others: type of call (voice, modem, fax etc . . . ), compression speed (required or not), echo cancellation (required or not), priority, etc . . . This ATM call is received and decoded by ATM hub 1470 which recognizes the need to the access of the voice server functions and, then, forward the ATM cell to the voice server brick 1420. To achieve this, ATM hub 1470 encapsulates the ATM cell that was received from station A into an ATM frame that was defined above. This is achieved by replacing the current VP/VC of the ATM cell call by the VP/VC that characterizes the specific communication link between the ATM hub 1470 and voice server 1420. In the case where such a VP/VC was not yet affected, the ATM hub 1470 initiates such a request to the Tower Manager 24 of the FIG. 3. The tower manager function can be handled by any brick, for example Tower Manager 24 of FIG. 3 is located in brick 1410 of the tower described in FIG. 14. Such a request was described with details, particularly with reference to the flow charts of FIG. 9, 11 and 12. In addition to the replacement of the VP/VC in the ATM call cell, the ATM hub 1470 introduces the routing header in order to construct the ATM frame. This is achieved in accordance with the contents of the routing table that exist in every brick and is under control of the tower management brick 24, as described above in reference with FIG. 9.

The ATM call cell that is processed by the ATM hub 1470 is then transmitted to the voice server brick 1420 via the appropriate path that was determined by the tower management brick 24, and stored into the routing tables of the corresponding intermediate bricks. Let us assume that this path defined by the succession of bricks 1470, 1445, 1430, 1425 and 1420. As was explained above with details, when the ATM cell is presented in one entry of one intermediate brick, e.g. I.S.D.N. gateway brick 1430 at the RIGHT entry, the following processing is performed. The ATM frame is detected at the RIGHT receive interface 604 of FIG. 4 and presented to the ATM receiver logic block 4. As particularly shown in FIG. 5 and explained in the corresponding specification, the ATM receiver logic block 4 (504) reads the value of the VP/VC that is carried by the frame and addresses its routing table (loaded in NVRAM 530) with VP/VC in order to extract the appropriate value of the routing header, and, finally, for replacing the current routing header with the newly defined one. This was particularly described with respect to FIG. 5 with the use of the selector 580 for swapping the routing headers before the newly defined ATM frame is stored into register 590.

The ATM frame is then switched in switch 200 in accordance with the value of the newly defined routing header. In the present case, it should be noticed that the ATM frame is presented to the PORT_1_OUT and presented to the UP Xmit interface 701.

It then appears that the ATM frame can be successively switched until it is presented and received by the VOICE server brick 1420. Voice server 1420 checks the ATM frame being received and checks whether the latter is a actual connection setup ATM cell and determines the destination of the call.

Should the destination of the call go to the external ISDN network, then a second session between Voice server 1420 and ISDN gateway 1430 can be established as shown in FIG. 15A. This session allows the request to be forwarded to ISDN gateway 1430. It should be noticed that, as explained above, the second session involves the transmission of ATM cells which are routed from the VOICE server 1420 to the ISDN gateway brick 1430 via a set of intermediate bricks as defined in the routing tables loaded into the NVRAM 530 of the different bricks that composes the routing path. Similarly, the call setup request is forwarded to Interface brick 1435 by means of the third ATM tower session, so that a standard ISDN setup call can be forwarded to the public network. As known by the skilled man, such a call results in a setup negotiation between the two end entities that wish to communicate with each other via the external ISDN network, the negotiation including the determination of the utilization of the echo cancellation mechanisms and compression rates if any. When these parameters are available, and assuming that both echo cancellation and voice compression are needed, the process proceeds with a fourth and a fifth ATM tower sessions, respectively between ISDN gateway 1430 and echo canceller 1440; and ISDN gateway 1430 and Voice compression 1460. Some internal tests can then be performed in these two bricks in order to ascertain that processing resources are still available for actually performing echo cancellation and voice compression. In addition to the five mentioned control ATM sessions, the connection and setup phase completes with the establishment of some additional data ATM sessions which are requested by ISDN gateway 1430 to Tower Manager 24, as illustrated in FIG. 15A. These additional ATM sessions include a session between VOICE server 1420 and VOICE compression 1460; VOICE compression 1460 and ECHO CANCELLER 1440; and ECHO CANCELLER 1440 and Interface brick 1435. When the request succeeds, Tower Manager 24 establishes the ATM sessions and provides the four destination bricks—as well as the intermediate bricks composing the routing path—with the VP/VC which is allocated in accordance with the procedure that was described above with respect to FIG. 9. ISDN gateway 1430 can then be acknowledged with the successful establishment of the data ATM sessions.

The first phase then completes with an acknowledgment of the end of the setup procedure which is forwarded to station A, the latter, as known in the art, particularly involves cross verification between the ISDN gateways of the two communicating devices through the external ISDN network.

The first connection and setup phase is then followed by the second phase, the so-called data communication phase. This phase involves the transmission of ATM data cells which contains digitalized voice through the path that was defined during the first connection and set-up phase, that is via the sequence of ATM hub brick 1470, Voice server 1420, voice compression 1460, Echo canceller 1440 and Interface brick 1435. This data path is illustrated in FIG. 15A in reference with the "D" letter characterizing the data path (the letter "C" characterizing the above described control path). This sequential transmission of ATM cells complies with the above mentioned description. More particularly, assuming that one ATM cell comprising digitalized voice is generated by Station A and transmitted to ATM hub 1470. As was explained above, the ATM cell is transmitted to voice server 1420 by means of succession of bricks 1470, 1445, 1430 and 1425. When VOICE server 1420 receives the ATM cell it processes the latter by replacing the existing value of VP/VC by that characterizing the ATM session between VOICE SERVER 1420 and VOICE COMPRESSION 1460.

Assuming that the Tower Management brick 24 has defined the routing path between VOICE Server 1420 and VOICE COMPRESSION 1460 as comprising intermediate brick 1440, it appears that the ATM cell which is transmitted from VOICE SERVER 1420 and VOICE COMPRESSION is as follows. When the ATM frame is presented to the left input (RECEIVE_INTERFACE_3 circuit 603 of FIG. 4) of Echo_canceller 1440, the ATM Receiver_Logic_block_3 503 reads the value of the VP/VC that is carried by the frame and addresses its routing table (loaded in NVRAM 530) with VP/VC in order to extract the appropriate value of the routing header, and, finally, for replacing the current routing header with a newly defined one as described above with respect to FIG. 5.

The data communication is then followed by the third disconnection phase which operates similarly as the setup phase but will result in the release of all the tower sessions that were established.

FIG. 15B illustrates a second communication situation which represents the processing of a phone call from phone 2A 1520 attached to PBX A 1530 on FIG. 14. In this situation this call will be sent to the external primary ISDN Line that is attached to Interface brick 1435. Similarly as above, the situation involves three main phases: a first connection set-up phase, a data communication phase and a disconnection phase which completes the process. Additionally, this will involve the establishment of a set of ATM communication sessions between some bricks of the communication tower.

The first phase is a connection setup phase. This phase involves a set of particular control sessions, including the establishment of a first control session between PBX A 1530 and Interface brick 1435. It should be noticed that this first control session may be an ATM session or, alternatively, a non ATM session such as a QSIG or ISDN session. The first phase additionally includes a second ATM session between Interface brick 1435 and ISDN Gateway 1430. It should be noticed that the system will associate the two former first and second sessions in order to establish a higher level session between PBX A 1530 and ISDN gateway 1430 to handle the signalling protocol, such as Q.931/Q.921 protocols defined in the CCITT recommendations or the similar protocols. Assuming that the call involves the use of voice compression and echo cancelling mechanism, the first phase further involves a third ATM session (resp. a fourth ATM session ) between ISDN gateway 1430 and Voice compression 1460 (respectively between Echo_Cancellor 1440 and ISDN Gateway 1430).

The first, second, third and fourth sessions are control ATM sessions that need to be established for the operating of the tower. In addition to the control sessions, there are provided the following sessions which are dedicated to the communication of data. A fifth ATM session is established between Interface brick 1435 and Voice_compression 1460. Further a sixth ATM session is established between Voice_compression 1460 and Echo_cancellor 1440. Further a seventh session is initiated between Echo_cancellor 1440 and Interface brick 1435.

Now it will be described more particularly how these seven ATM sessions are established and used in the first phase.

Upon detection of an external call being requested by phone 2A 1520, PBX A 1430 sends a corresponding request to ISDN gateway 1430. It should be noticed that the sessions between ISDN gateway 1430 and Interface brick 1435 may be a permanent session when the PBX does not run any ATM protocol. When this request is being detected ISDN gateway 1430 establishes a call on the S2 external ISDN line in order to exchange the parameters that will be used for the communication between the two communicating entities. Also, if needed, ISDN gateway 1430 establishes two ATM sessions with respectively Voice_compression 1460 and Echo_cancellor 1440. As described before, this establishment is achieved by means of the use of the tower manager 24 which, upon detection of the ATM cells containing the request of ISDN gateway 1430, establishes all the required ATM sessions. The two ATM control sessions with Echo_cancellor 1440 and Voice_compression 1460 allows ISDN gateway 1430 to check that the needed computing resources are available for performing the corresponding tasks. If resources are still available, ISDN gateway 1430 performs, via the established ATM sessions, the configuration of the two Voice_compression 1460 and Echo_cancellor 1440. Accordingly ISDN gateway 1430 configures Interface brick 1435 in order to route and use the appropriate VP/VC which are provided by the Tower Manager 24. At last ISDN gateway 1430 will confirm the establishment of the call to the remote communication party. Upon detection of the acknowledgment from the latter, ISDN gateway 1430 confirms the full success of the initialization setup phase to the PBX A 1530 which can then proceed with the second data communication phase.

The second data communication phase uses the following path. The data flow is propagated through the PBX A 1530, then to the Interface brick 1435, then to the Voice_compression brick 1460, then to Echo_cancellor 1440. The data flow then comes back to Interface brick 1435 and can then be routed to the S2 external ISDN line. It should be noticed that, as was described above with details, the propagation of data is achieved by means of successive transmission of ATM cells between the intermediate bricks so that to fully constitute the routing path.

The process then proceeds with the third disconnection phase which, similarly to the setup phase, uses the same control ATM sessions. Indeed when the disconnection message from PBX A 1530 is received by ISDN gateway 1430, the latter releases the resources that were used by this call, and particularly those in Echo_cancellor 1440 and Voice_compression 1460. In the case where no other call remains established, ISDN gateway proceeds with the releasing all the control and data ATM sessions, except that between ISDN gateway 1430 and Interface brick 1435 since PBX 1530 is not natively ATM.

Figure 16:
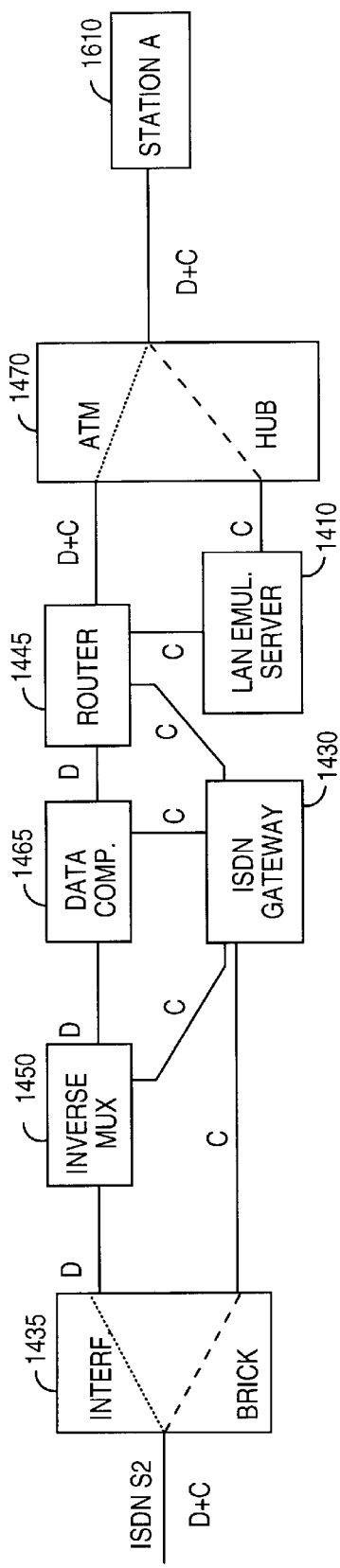
FIGS. 16A and 16B illustrate a logical flow chart of the processing of data call from station A to a Server B that is located on a remote communication structure.
Figure 16:
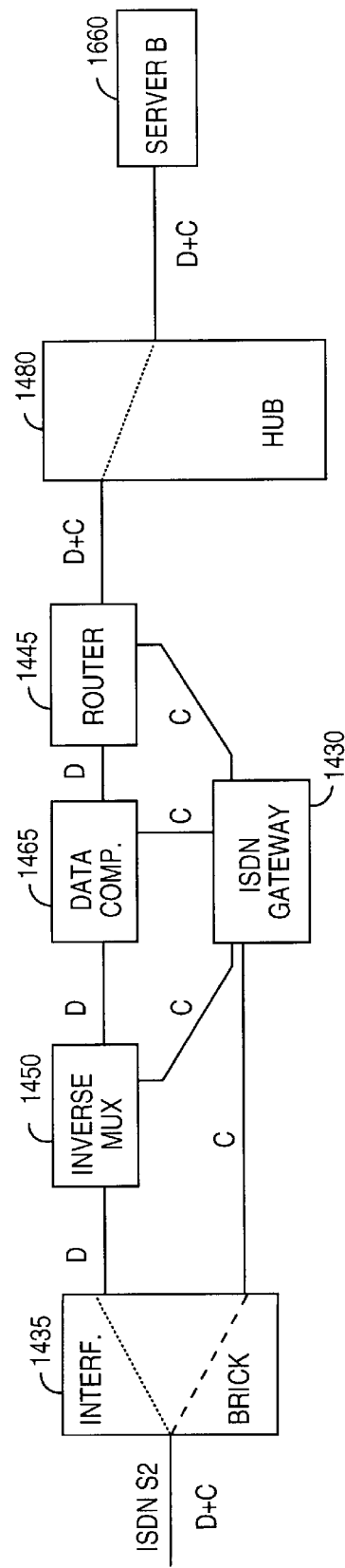

FIGS. 16A and 16B represents the logical flow chart illustrating the processing of a data call from station A of FIG. 14 to a Server B located on a remote communication structure similar to the one described in FIG. 14. FIG. 16A particularly depicts the station A attachment and control while FIG. 16B illustrates the arrangement of the sessions that are involved for the connection of the server B.

As shown in FIG. 16A, this communication involves the establishment of the following control sessions: a first control session between router 1445 and LAN Emul. Server 1410; a second control session LAN Emul. Server 1410 and ATM hub 1470; a third control session between Router 1445 and SON gateway 1430; a fourth control session between ISDN gateway 1430 and Interface brick 1435; a fifth control session between ISDN gateway 1430 and Data_compression 1465; a sixth control session between ISDN gateway 1430 and Inverse Multiplexor 1450.

Additionally the communication involves the following two data communication sessions: a first one between Router 1445 and Data_compression 1465 and a second one between Data_compression 1465 and Inverse_Multiplexor 1450.

At last the communication involves a set of two additional data and control ATM sessions: a first Station A 1610 and ATM hub 1470 and a second control session between ATM hub 1470 and router 1445.

A data call from the station of Location A and the server of location B will use the following path. As the station is an ATM station and the server is located on a shared media LAN, the LAN Emulation Server 1410 will be used to establish the call. The latter and station A through ATM hub 1470 will pass their data thru the local Router 1445 to be routed in Internet Protocol (IP). Local router 1445 utilizes the functions that are provided into ISDN gateway 1430 in order to establish a call on the external S2 ISDN line, and setup local functions such as Inverse_Mutiplexor 1450 and Data_compression 1465. The IF flow between the routers of the two communicating parties will be compressed and decompressed using the data compression function, that is brick 1465, then the data will go to the inverse multiplexing function into brick 1450 in order to get four 64 kbps which are merged together to get an aggregate link of 256 kbps. Data will then use the 256 permanent channel established at start-up by the ISDN gateway as this call is permanent.

FIG. 16B represents the different sessions that are required in order to connect the precedent call to server B 1660. As shown in the figure this involves the setup of the following control sessions:

a first session between Interface brick 1435 and ISDN gateway 1430; a second session between ISDN gateway 1430 and Inverse_Multiplexor 1450; a third session between ISDN gateway 1430 and Data_compression 1465;

a fourth session between ISDN gateway 1430 and Router 1445. Additionally a set of data sessions are established between the following bricks: a session between Interface brick 1435 and Inverse_Multiplex 1450; a second one between the latter and data compression 1465; a third session between data compression 1465 and Router 1445. At last two data and control sessions are also established between hub 1480 and respectively Router 1445 and Server B 1660.

The initialization involves a first message from Interface brick 1435 (being the message sent by the other entity) to the ISDN gateway 1430. The latter then informs Router 1445 and sets up Inverse_Multiplexor 1450 and Data_compression 1465 with the parameters that are received from the communicating party. The control phase is then completed. Then the data can be routing by means of the following path: Interface brick 1435; Inverse Mux 1450; Data_compression 1465; Router 1445; Hub 1480 and, at last, Server B 1660. As was particularly described above, this communication is physically achieved by means of successive transmittal of ATM cells between the bricks of the communication tower, in accordance the routing tables that were defined by the Tower Manager 24 during the establishment of the ATM sessions. The data communication phase ends with the disconnection phase which uses the same control ATM sessions that were defined in the Setup phase for releasing the features which were used for that call. If no call are still running or to be processed, the process completes with the release of all the ATM sessions.

Figure 17:
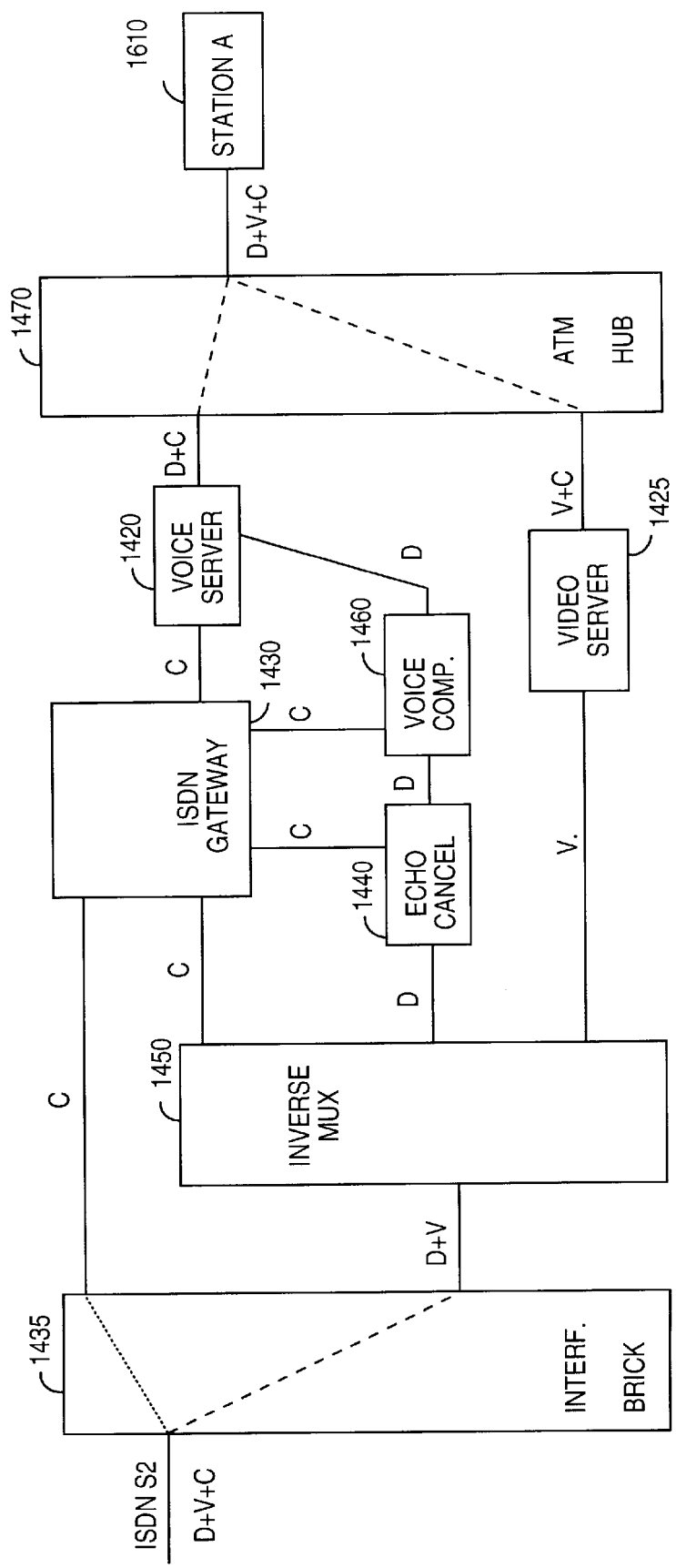
FIG. 17 illustrates the processing of video conference exchange between two stations.

FIG. 17 represents a logical flow chart illustrating the processing of a video-conference exchange between Station A of FIG. 14 and a similar station B on a remote location.

This situation involves the establishment of the following control sessions including a first control session between interface_brick 1435 and ISDN_Gateway 1430, a second, third, fourth and fifth sessions between the latter and respectively Inverse_Multiplexer 1450, Echo_canceller 1440, Voice_compression 1460 and Voice server 1420.

Additionally there needs to be established the following data sessions: a first data session between Inverse_Multiplexer 1450 and Echo_canceller 1440, a second data session between the latter and Voice_compression 1460 and a third data session between voice_server 1420 and voice_compression 1460.

Further one mixed data and control session is established between Voice_server 1420 and ATM_Hub 1470 while a mixed video and control session is made between ATM_Hub 1470 and Video_server 1425. The latter will have a additional video session established be between itself and Inverse_multiplexer 1450. A specific Data and video session will also be established between Interface_Brick 1435 and Inverse_multiplexer 1450.

At last the process involves a data/video/control session between station A 1610 and ATM hub 1470.

A video conference is established by request of station A 1610. This will lead to proceed to the first connection and setup phase. This request is forwarded first to Voice_Server 1420 which will process it with the same process used and described in FIG. 15A. The only difference is that some parameter will be changed like the number of B channels required for the call. On request of voice server 1420, ISDN_Gateway 1430 will process this multiple request onto the external S2 ISDN line. For example, two 64k channels will be requested by the ISDN gateway. Assuming that the above request is answered successfully, ISDN Gateway 1430 will establish (if not yet established) all remaining control, data, video and complex sessions and will answer to Station A 1610 through Voice Server 1420 to proceed with the video conference. Station A will initialize Video_server 1425 through ATM_Hub 1470 with the needed parameters (some just being given by ISDN Gateway 1430) and will proceed with the data/video phase.

The data part of this data/video phase will path through ATM_Hub 1470, Voice server 1420 and will continue by using the voice_compression function 1460 and the inverse multiplexing function 1450 where data and video are merged together using for example H.320 mapping format of this CCITT recommendation and are then sent to the external S2 ISDN line through Interface_Brick 1435. and optionally to the video server function.

The voice part of the above phase is send to and proceed by video_server 1425 using a different routing path within ATM_Hub 1470 as shown on FIG. 17. The latter will run for example the H.261 video compression of the CCITT or an equivalent one such as MPEG. then the compressed video is sent from video_server 1425 to the Inverse_Multiplexer 1450 and is processed as described above.

The last phase will be the disconnection phase that will use the same control sessions established in the first phase. This may lead to the suppression of some not longer used sessions or all sessions except control session between Interface brick 1435 and ISDN_Gateway 1430 which should remain permanently established.

Figure 18:
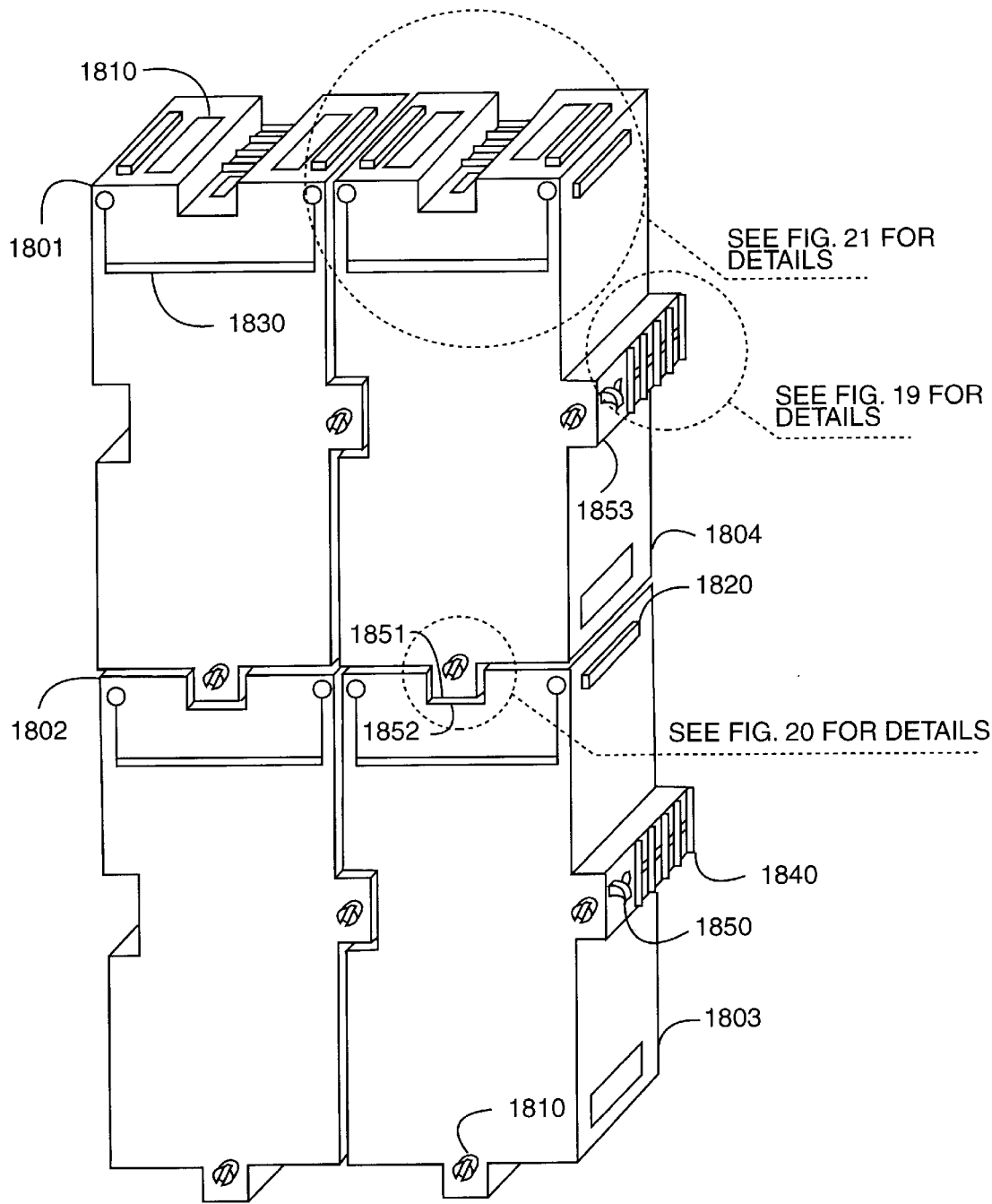
FIG. 18 is a logical flow chart illustrating the processing of a video-conference exchange between a Station A in the Tower structure and a second Station B.

FIG. 18 is an illustration of a particular mechanical embodiment of the invention for each elementary Brick forming part of the Tower structure. The figure illustrates a set of four identical mechanical components, which are referred to as Bricks 1801, 1802, 1803 and 1804. Each Brick—for instance Brick 1804—shows at its lower surface a protrusion 1851 which is intended to enter into a corresponding groove 1852, machined at the upper surface of the next adjacent Brick 1803 that is located below Brick 1804. Similarly Brick 1804 includes a right lateral face that shows a protrusion 1853 which is intended to enter into a corresponding (not shown on the figure) groove, formed at the left surface of the next adjacent Brick that is located at the right position of Brick 1804. The upper surface of each Brick is provided with two distinct clearance bars 1820 located into corresponding recesses formed in the surface of the Brick. An additional clearance bar is provided on the top part of the right lateral face of the Brick. An handle 1830 is provided for controlling the movement of the clearance bars, as described below. It should be noted that the dimensions of the protrusions formed in each of the Bricks are smaller than the dimensions of the grooves so as to set a clearance between the Bricks.

In the invention, the combination of two confronting faces—a protrusion of one Brick confronting a corresponding groove of the facing Brick—is intended to provide the five following functions.

A first function is obviously the mechanical attachment between two contiguous Bricks. This is particularly achieved by means of the fixing screws 1810 and locking mechanisms 1850 that provides proper contact and physical security.

Figure 20:
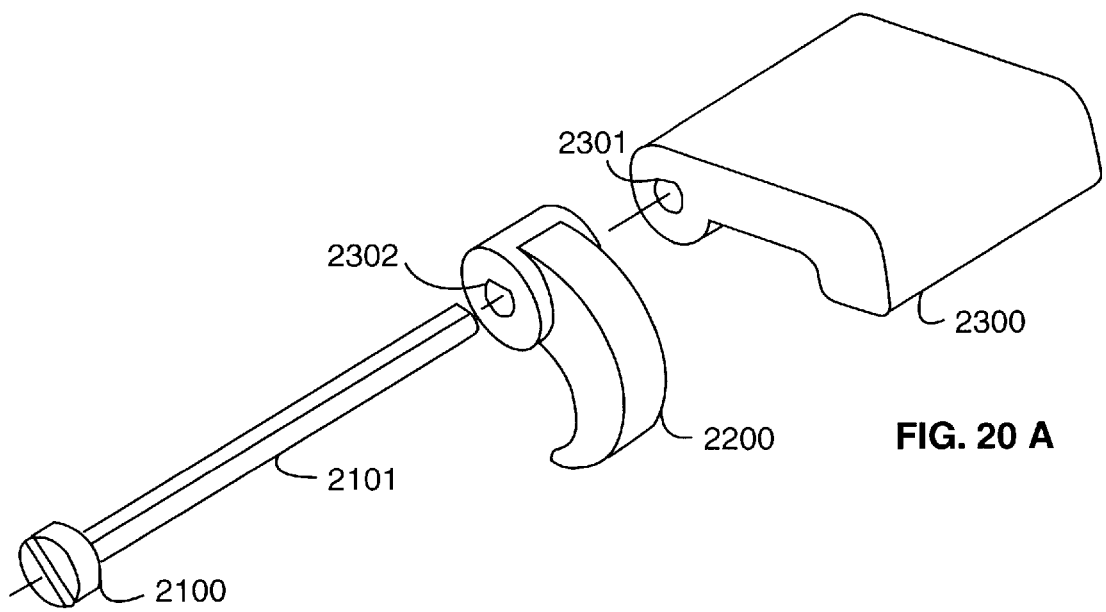
FIG. 20A and 20B respectfully illustrates details of the camming hook 2200 and the mechanical locking mechanism.

The electrical connectivity is the second function that is provided by the mechanical attachment and locking device of the invention. This is achieved by means of screw 1810 which controls the engagement of an electrical contact or connectors as will be shown hereinafter with greater details with respect to FIG. 20. It should be noticed that the electrical connection is essentially dedicated to provide power supply to the Brick being connected since the data and control signals are basically transmitted and received via the Tower Area Network of the invention based on the optical LAN network. However as was mentioned above, it is still possible to integrate existing cards and communication circuits by using the traditional electrical connectors. In this specific case, the screw 1810 is used both for ensuring power supply connections as well as data and control electrical connections.

A third function is the mechanical clearance mechanism. As will be shown below this allows to ease the mechanical attachment between two contiguous Brick and, therefore, to allow easy plug and unplug of the latter. This will be particularly described with respect to FIG. 21 and will involve the use of both clearance bar 1820 and handle 1830.

The fourth function is dedicated to the transmission and reception of ATM data cells. This is provided by means of a proximate optical transmission which is established between two contiguous Bricks. This optical transmission is based on the use of Light Emitting Diodes (L.E.D.) and corresponding photodetectors that are located on the two matching groove and protrusion of two considered contiguous Bricks. More particularly, Brick 1804 has its protrusion which shows an set of two LED diodes and two photodetectors which, when cooperating with corresponding photodetectors and LEDs located on the facing groove of the next Brick, provides a bi-directional optical connectorless communication between the two facing Brick. Protective blades 1840 are used to avoid optical crosstalk as will be described with more details with respect to FIG. 19.

The fifth function is the cooling function which allows the effective cooling of the different Bricks forming the Tower Structure. As shown in FIG. 18, this cooling is achieved by means of a set of apertures located on the four faces of each bricks.

The apertures which are used for providing the cooling function are implemented on each 4 sides of the brick. They are used for propagating the cooling from the power/cooling Brick to the above or lateral Bricks. Several internal implementations may be used. The main requirements for doing this implementation is to permit the propagation of the cooling from bottom to up except if this source of cooling appears to be not sufficient. In this case, lateral cooling can be used thanks to a set of valves which are located on each input aperture in order to route the cooling in a lateral way. Bricks may use the power/cooling Bricks fans or can also be fitted with their own fans in order to enhance the cooling function.

Figure 19C:
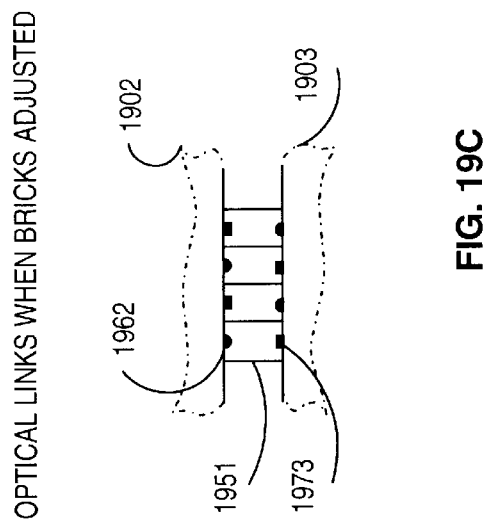
FIG. 19C shows a detail of the optical coupling between two adjacent faces of two bricks.
Figure 19A:
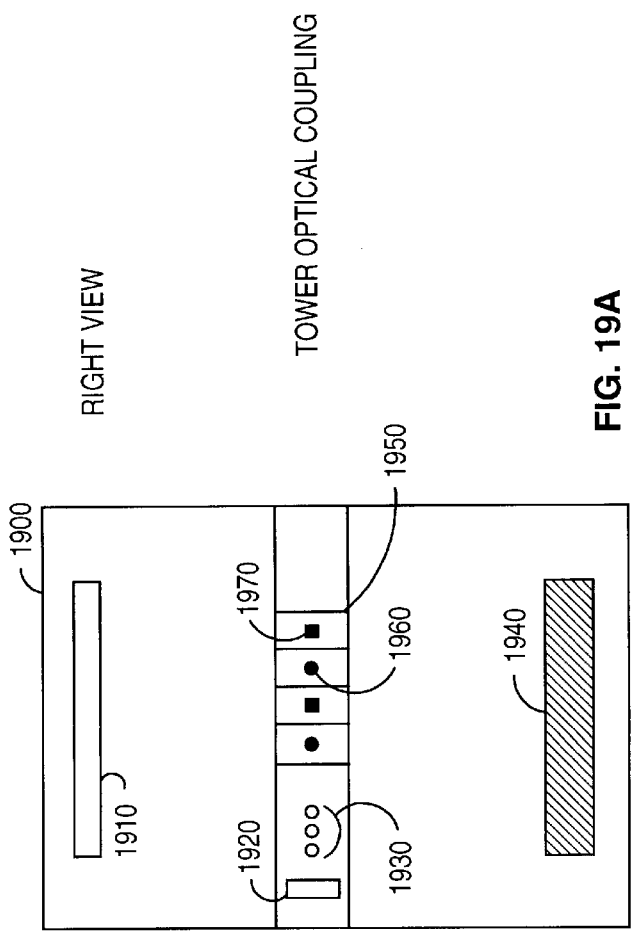
FIGS. 19A and 19B respectively illustrate details of the lateral and top faces on one elementary Brick or station.
Figure 19B:
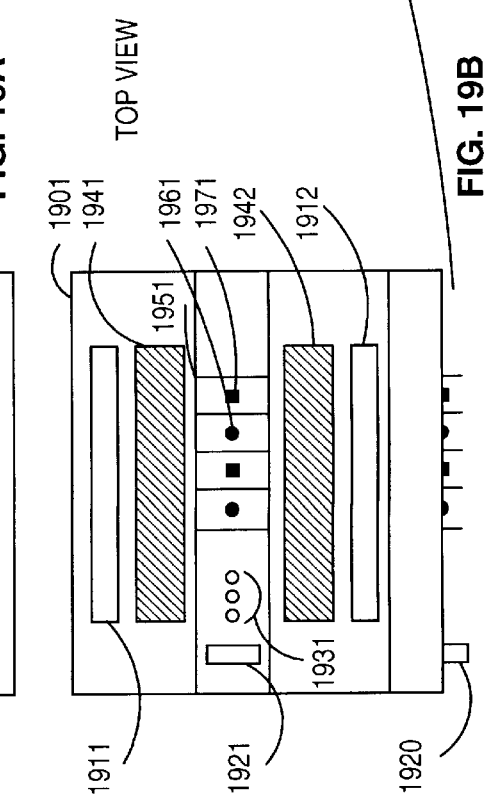

FIG. 19a and 19b particularly shows details of the lateral and top faces of one elementary bricks. FIG. 19a shows the lateral clearance bar 1910, the cooling aperture 1940 located on the bottom, and, located on the protrusion, the locking mechanism 1920 that will be described hereinafter with more details associated with three distinctive power electrical connectors 1930, and two sets of LED elements 1960, photocouplers 1970 and blade elements 1950.

Similarly FIG. 19b shows the top face of one elementary Bricks. There are shown details of two clearance bars 1911 and 1912, two cooling apertures 1941 and 1942, and located on the protrusion, the locking mechanism 1921 associated with three power electrical connectors 1931, and two sets of LED elements 1961, photocouplers 1971 and blade elements 1951. FIG. 19b also shows a portions of the camming hook of the locking mechanism and LEDs and photocouplers that extend from the lateral face.

FIG. 19c shows a detail of the optical coupling between two adjacent faces of two Bricks 1902 and 1903. In this Figure, 1973 represents the photocoupler and 1962 represents the LED.

FIG. 20a shows more particularly the detail of the camming hook 2200 which is pivotally mounted inside each Brick and which is associated with each protrusion. Camming hook 2200 is pivotally coupled through an axel 2101 extending respectfully through an elongated aperture 2301 formed at one end of lever arm 2300, and an elongated aperture 2302 of hook 2200.

Figure 20B:
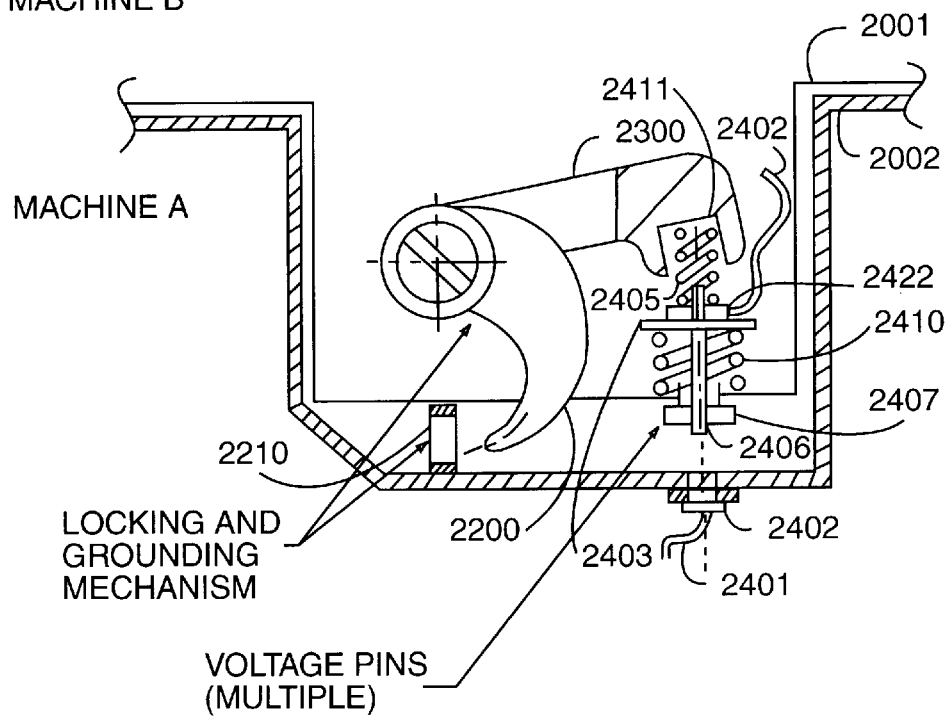

FIG. 20b shows additional details of the locking mechanism. Camming hook 2200 is coupled with lever arm 2300 and can be pivoted manually.

The dielectric non conductive distal end of 2300 includes at least one recess 2411, the bottom of which engages one end of a compression coil spring 2405 whose other end is spring biased against an electrically washer 2403 whose lower surface thereof engages a second compression coil spring 2410, the lower end of which engages the interior surface of the protrusion of the superior Brick 2001. Extending through an electrically insulated aperture of said lower surface of the protrusion is a rod 2406 (not circular in cross section in the embodiment shown) whose lower end is rigidly secured to a second washer 2407, the upper end of rod 2406 being rigidly secured to washer 2403. Electrical contact 2422 is affixed to washer 2403. Electrical contact 2422 is electrically connected to power supply electrical wire 2422. Rod 2406 has a lower end facing an electrical contact 2402 which is affixed to the upper surface of the lower Brick. Contact 2422 is electrically connected to a power supply electrical wire 2401 of the lower Brick.

It should be noticed that coil spring 2405 has a rate that is higher than the rate of spring 2410.

When axel 2101 is manually—as by a control head 2100—or otherwise, pivoted clockwise (in FIG. 20a), the distal end of camming hook 2200 forceably engages a locking aperture 2210 formed at the upper groove of the lower Brick 2002, lever arm 2300 pivots in unisson with camming hook 2200 and, its distal end moves downward, thus compressing first spring 2410. When the lower end of rod 2406 engages contact 2402 the downward movement of rod 2406 ceases and any further pivoting movement of lever arm 2300 compresses spring 2405 until camming hook is fully engaged in locking aperture 2210. The man skilled in the art will realize that the uncompressed length of springs 2405 and 2410 as well as the profile of camming hook 2200 are selected so that hook 2200 is stopped by frictional contact with the locking aperture 2210 before the spring 2405 reaches its full compressed state. Such details are well known to the skilled man and will not be further described.

FIG. 21a shows the particular mechanism that is used for either providing the rigidity of the different elementary Bricks that are attached or, for providing the necessary clearance that allows the unplugging of one elementary Brick. As mentioned above, the clearance is achieved by means of a set of clearance bars 2120 that can be controlled by handle 2110. Clearance bar 2120 is fitted with a first and a second bevel at its two bottom corners as shown in the figure. The mechanism further comprises a wedge 2141 facing and extending along the first bevel of clearance bar 2120. Extending from wedge and rigidly secured thereto is a rod 2140. It should be noted that wedge 2141 and rod 2140 are fixed in position with respect to the upper surface of each Brick. The free end of rod 2140 extends through an aperture (not referenced) formed in a second wedge 2130 movable in translation along the rod. A compression coil spring 2150 is mounted between wedge 2130 and a washer 2151 rigidly secured to rod 2140. Bearing against the outer lateral surface of wedge 2130 is an eccentric 2111 which can be clockwise or counterclockwise manually rotated through a handle 2110 affixed to the axis of the eccentric.

The removal of one particular Brick of the structure first requires the unlocking of the individual links between that Brick and its neighbouring ones. This is achieved by means of a counterclockwise movement of the up to four axel 2001 pivotally affixed to their corresponding locking camming hooks. Then, the rotation of handle 2110 of FIG. 21*b* achieves to ease the Brick with its neighbours by means of the clearance bars 2120, 2121 and 2122.

Indeed, when handle 2110 is pivoted counterclockwise, eccentric 2111 is similarly pivoted. The profile of eccentric 2111 allows wedge 2130 to be biased rightwards as shown on the figure by spring 2150. As wedge 2130 is spaced apart from wedge 2141, clearance bar 2120 moves downwards due to gravity forces (that is to say its own weight as well as the weight of the upper Bricks). This results in the reinstoring of the clearance between the Bricks, and allowing easy removal of the Brick whose handle has been pivoted.

Conversely, when a Brick has been inserted into the structure, the clockwise rotation of handle 2110 causes the similar clockwise rotation of eccentric 2111 which profile results in the leftwards translation of movable wedge 2130 and the compression of spring 2151. The distance between fixed wedge 2141 and movable wedge 2130 tends to decrease, thus suppressing the clearance between the Bricks.

The rotation of handle thus achieves a right positioning of the newly installed Brick into the structure. The locking can then be performed by means of the rotation of screws 2100 causing the engagement of camming hooks 2200 into their corresponding apertures 2210.

If blocks 2130 are fitted with two inclined surfaces as shown in FIG. 21*c*, each surface can be associated with a corresponding clearance bar (such as 2121 and 2122), thus allowing a single block to activate two distinct clearance bars.

It should be noted that the drawing of FIG. 21*a* are schematic only and that the skilled man will straightforwardly design all the not shown details. For example, the man skilled in the art will straightforwardly realize that rod 2140 should be provided at its free end with an abutment so as to prevent wedge 2130 from leaving rod 2140 when biased by spring 2150.

As the description has been particularly elaborated with the use of ATM cells having 53 bytes, it should however be clear to the skilled man that the invention is not limited to the use of 53 bytes long cells and could be embodied with cells of different lengths and, more generally, in any case of Asynchronous Transfer modes.

Also it should be noticed that the invention can be easily adapted in order to allow the construction of the Tower Structure in the three distinctive directions. Therefore this allows the possibility to assemble a wide number of different Bricks. In this case, switch 200 should be fitted with at least 7 input ports and 7 output ports.

We claim:

1. Package for communication equipment fitted with mechanical locking mechanism and electrical and communication connectivity device for allowing power supply distribution as well as communication at least at four distinctive faces (UP, DOWN, RIGHT, LEFT), said package being characterized in that it comprises:

two faces having one each protrusion at one surface that is intended to enter into a groove machined at a corresponding surface of the next adjacent package in said structure;

each of the said two protrudent faces further comprising a locking mechanism and power supply connection that comprises:

a camming hook (2200) having a distal end which forceably engages a locking aperture (2210) when pivoted, said hook being pivotally coupled through an axel (2101) extending respectfully through an elongated aperture (2301) formed at one end of a lever arm (2300), and an elongated aperture (2302) of said camming hook (2200), said lever arm (2300) having a dielectric non-conductive distal end including at least one recess (2411), the bottom of which engages one end of a first compression coil spring (2405) whose other end is spring biased against a first washer (2403) whose lower surface thereof engages a second compression coil spring (2410), the lower end of which engages the interior surface of the protrusion of the adjacent package, said first coil spring (2405) having a rate being higher than the rate of said second coil spring (2410); and a rod extending through an electrically insulated aperture of said lower surface of said protrusion having a lower end being rigidly secured to a second washer (2407) and an upper end being rigidly secured to said first washer (2403), the lower end of said rod facing an electrical contact (2402) connected to a power supply electrical wire and which is affixed to the upper surface of the adjacent package; wherein the pivotation of said camming hook (2200) parallely causes the locking and the electrical connection of said package.

2. Package according to claim 1 having at least one face comprising a rigidity and clearance mechanism for providing clearance allowing easy removal of the package, said mechanism comprising:

at least one clearance bar (2120) fitted with a first and a second bevel; said clearance bar suppressing clearance that naturally exists between two adjacent packages, a fixed wedge (2141) facing and extending along said first bevel of said at least one clearance bar (2120);

a wedge (2130) being movable in translation with respect to said fixed wedge (2141), said wedge facing said second bevel of said clearance bar (2120);

a handle (2110) for pivoting an eccentric (2111) biasing said movable wedge, wherein the rotation of said handle causes movable wedge (2130) to space apart from fixed wedge (2141), resulting in a downward movement of said clearance bar (2120) reinstating a clearance between said package and its neighbouring package.

3. Package according to claim 2 characterized in that each lower and right surface shows a protrusion further comprising optical transmission and reception devices allowing communication between two adjacent packages.

4. Package according to claim 3 characterized in that it comprises apertures on the faces for achieving a cooling of the internal electronic circuits.

5. Package according to claim 3 characterized in that it further includes a switch (200) allowing the transfer of frame comprising n bytes header with n being an integer and an additional Asynchronous Transfer Mode cell.

6. Package according to claim 5 characterized in that it further comprises a switch (200) allowing communications in four distinctive directions (UP, DOWN, LEFT, RIGHT), and a computer for determining a new value of the routing header in accordance with tables loaded into an internal storage, said new value being used for controlling said switch.

7. A package comprising:

a housing having at least one communication interface;

a clearance mechanism associated with at least one face of the housing wherein the clearance mechanism includes:

- at least one clearance bar (2120) fitted with a first and a second bevel; said clearance bar suppressing clearance that naturally exists between two adjacent packages;
- a fixed wedge (2141) facing and extending along said first bevel of said at least one clearance bar (2120);
- a rod fixedly connected to the fixed wedge and extending therefrom;
- a wedge (2130) being movable in translation with respect to said fixed wedge (2141), mounted on said rod wherein said wedge facing said second bevel of said clearance bar (2120); and
- a handle (2110) for pivoting an eccentric to contact said movable wedge and a spring-washer assembly on said rod (2111) biasing said movable wedge, wherein the rotation of said handle causes the movable wedge (2130) to space apart from the fixed wedge (2141), resulting in a downward movement of said clearance bar (2120) restoring the clearance between said package and its neighboring package.

* * * * *